United States Patent
Yamazaki et al.

(10) Patent No.: US 9,397,311 B2
(45) Date of Patent: Jul. 19, 2016

(54) LIGHTING DEVICE

(71) Applicant: Semiconductor Energy Laboratory Co., Ltd., Kanagawa-ken (JP)

(72) Inventors: Shunpei Yamazaki, Tokyo (JP); Yasuyuki Arai, Kanagawa (JP); Yasuo Nakamura, Tokyo (JP); Yukie Suzuki, Kanagawa (JP); Yoshitaka Moriya, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/945,856

(22) Filed: Nov. 19, 2015

(65) Prior Publication Data

US 2016/0079553 A1   Mar. 17, 2016

Related U.S. Application Data

(62) Division of application No. 13/793,487, filed on Mar. 11, 2013, now Pat. No. 9,196,809, which is a division of application No. 12/723,040, filed on Mar. 12, 2010, now Pat. No. 8,405,116.

(30) Foreign Application Priority Data

Mar. 18, 2009 (JP) ................. 2009-066765

(51) Int. Cl.
*H01L 33/00* (2010.01)
*H01L 33/62* (2010.01)
(Continued)

(52) U.S. Cl.
CPC .......... *H01L 51/504* (2013.01); *H01L 51/5206* (2013.01); *H01L 51/5221* (2013.01); *H01L 2251/5361* (2013.01)

(58) Field of Classification Search
CPC .................. H01L 51/5036; H01L 2251/5361; H01L 2924/0002
USPC .................................... 257/79–103, 431–448
See application file for complete search history.

(56) References Cited

U.S. PATENT DOCUMENTS 6,225,552 B1  5/2001 Nishi et al.
6,565,231 B1  5/2003 Cok
(Continued)

FOREIGN PATENT DOCUMENTS

EP  1 367 674 A1  12/2003
EP  1 536 492 A2  6/2005
(Continued)

OTHER PUBLICATIONS

Korean Office Action re Application No. KR 2010-0023617, dated Feb. 15, 2016.

*Primary Examiner* — Cuong Q Nguyen
(74) *Attorney, Agent, or Firm* — Husch Blackwell LLP

(57) ABSTRACT

An object of the present invention is to reduce the thickness of a lighting device using an electroluminescent material. Another object of the present invention is to simplify the structure of a lighting device using an electroluminescent material to reduce cost. A light-emitting element having a stacked structure of a first electrode layer, an EL layer, and a second electrode layer is provided over a substrate having an opening in its center, and a first connecting portion and a second connecting portion for supplying electric power to the light-emitting element are provided in the center of the substrate (in the vicinity of the opening provided in the substrate).

24 Claims, 17 Drawing Sheets

(51) Int. Cl.
*H01L 51/50* (2006.01)
*H01L 51/52* (2006.01)

(56) References Cited

U.S. PATENT DOCUMENTS

| | | |
|---|---|---|
| 6,686,063 B2 | 2/2004 | Kobayashi |
| 6,787,990 B2 | 9/2004 | Cok |
| 7,075,226 B2 | 7/2006 | Cok |
| 7,189,466 B2 | 3/2007 | Moriyama et al. |
| 7,510,783 B2 | 3/2009 | Moriyama et al. |
| 7,629,062 B2 | 12/2009 | Moriyama et al. |
| 7,764,012 B2 | 7/2010 | Yamazaki et al. |
| 7,816,695 B2 | 10/2010 | Lin et al. |
| 8,283,677 B2 | 10/2012 | Takizawa et al. |
| 8,405,116 B2 | 3/2013 | Yamazaki et al. |
| 8,405,193 B2 | 3/2013 | Schaepkens et al. |
| 8,633,574 B2 | 1/2014 | Schaepkens et al. |
| 9,196,809 B2 * | 11/2015 | Yamazaki ............... H01L 51/52 |
| 2005/0122037 A1 | 6/2005 | Utsumi et al. |
| 2005/0258436 A1 | 11/2005 | Arai |
| 2008/0180936 A1 | 7/2008 | Ogashiwa |
| 2010/0236691 A1 | 9/2010 | Yamazaki |
| 2010/0237774 A1 | 9/2010 | Yamazaki et al. |
| 2010/0237805 A1 | 9/2010 | Yamazaki et al. |
| 2011/0169116 A1 | 7/2011 | Nanver et al. |
| 2011/0171763 A1 | 7/2011 | Lee et al. |

FOREIGN PATENT DOCUMENTS

| | | |
|---|---|---|
| JP | 04-010917 U | 1/1992 |
| JP | 2002-175877 A | 6/2002 |
| JP | 2003-264049 A | 9/2003 |
| JP | 2004-031341 A | 1/2004 |
| JP | 2005-158372 A | 6/2005 |
| JP | 2005-327708 A | 11/2005 |
| JP | 2005-332773 A | 12/2005 |
| JP | 2006-046947 A | 2/2006 |
| JP | 2007-018768 A | 1/2007 |
| JP | 2007-173424 A | 7/2007 |
| JP | 2007-173520 A | 7/2007 |
| JP | 2007-287701 A | 11/2007 |
| JP | 2007-294137 A | 11/2007 |
| JP | 2007-531238 | 11/2007 |
| JP | 2008-186618 A | 8/2008 |
| JP | 2008-218306 A | 9/2008 |
| JP | 2008-218309 A | 9/2008 |
| KR | 2005-0005527 A | 1/2005 |
| WO | WO 03/103341 A1 | 12/2003 |
| WO | WO 2005/104266 A1 | 11/2005 |

* cited by examiner

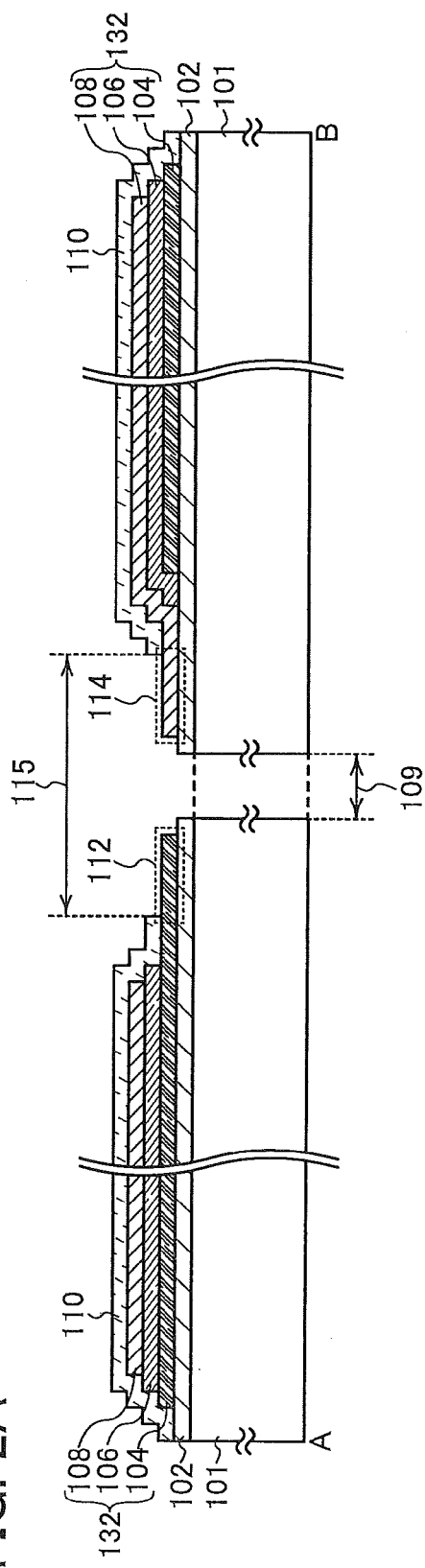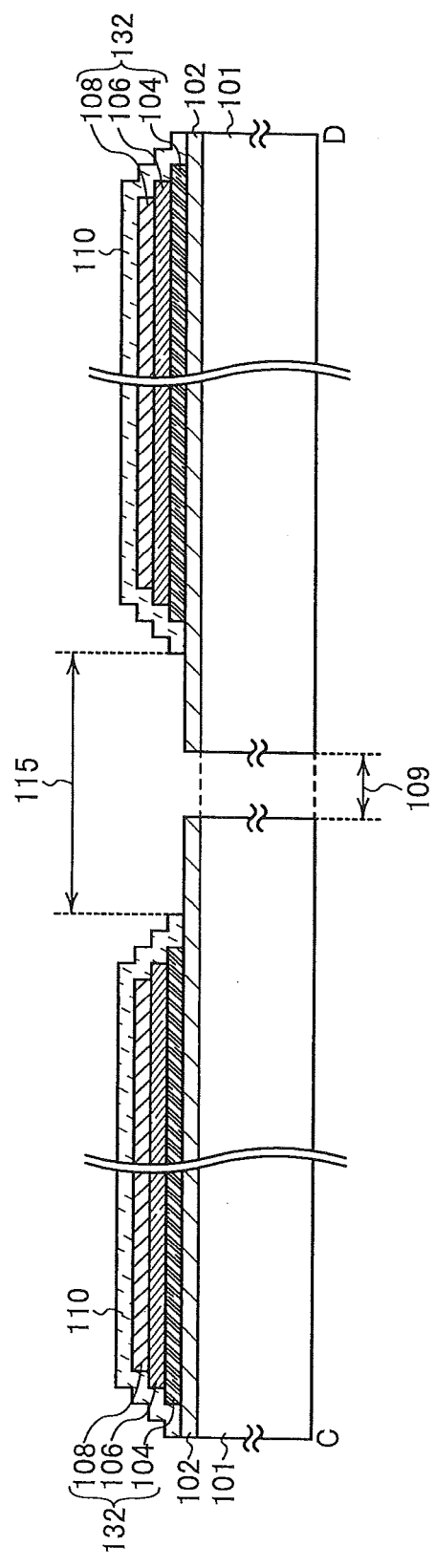

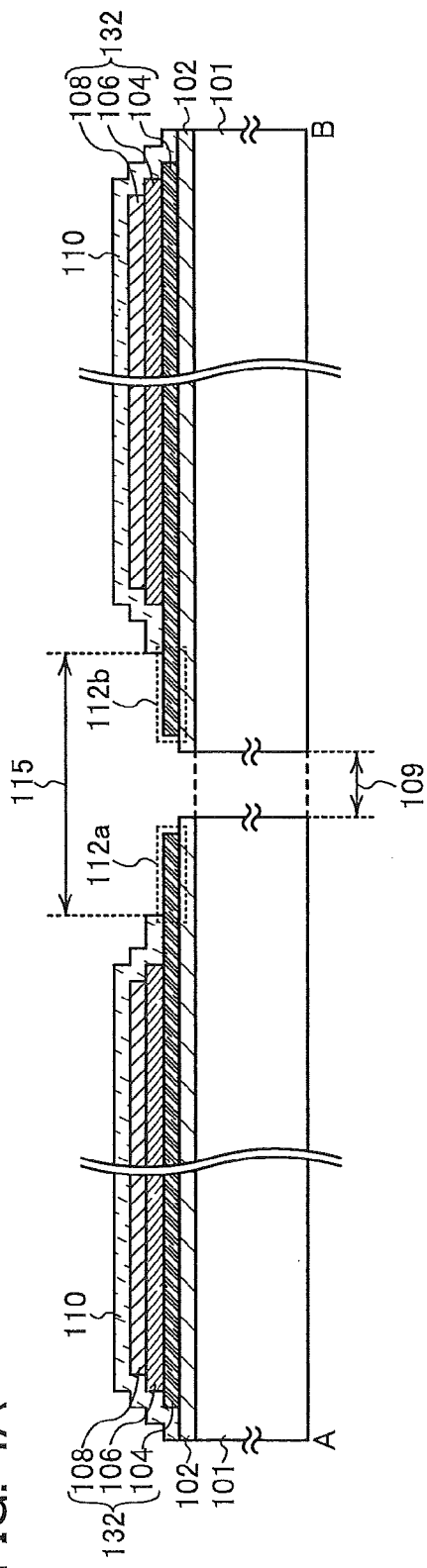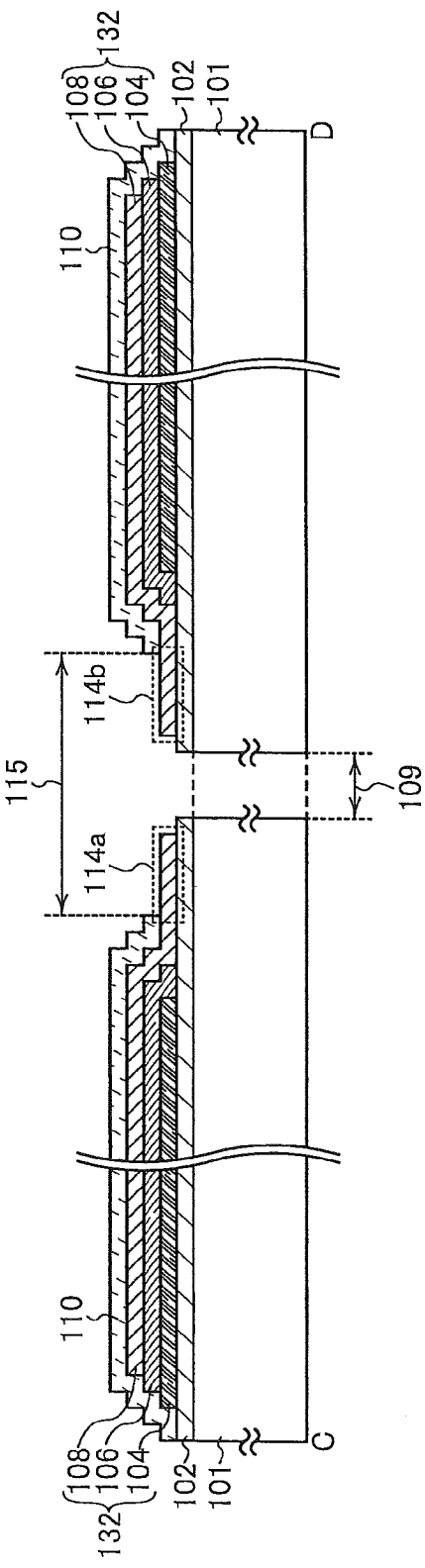

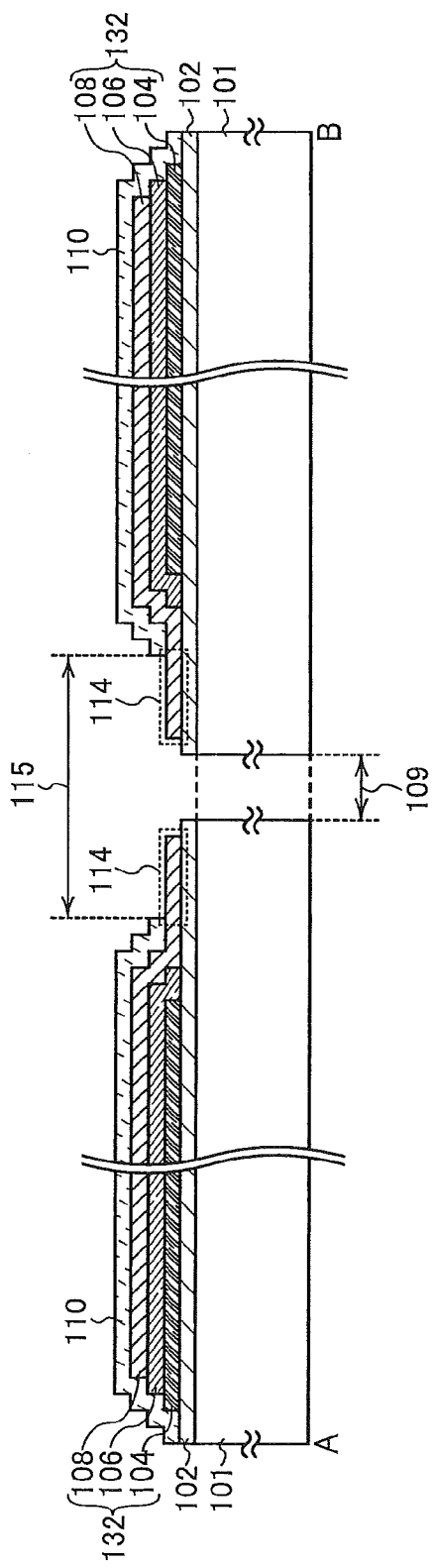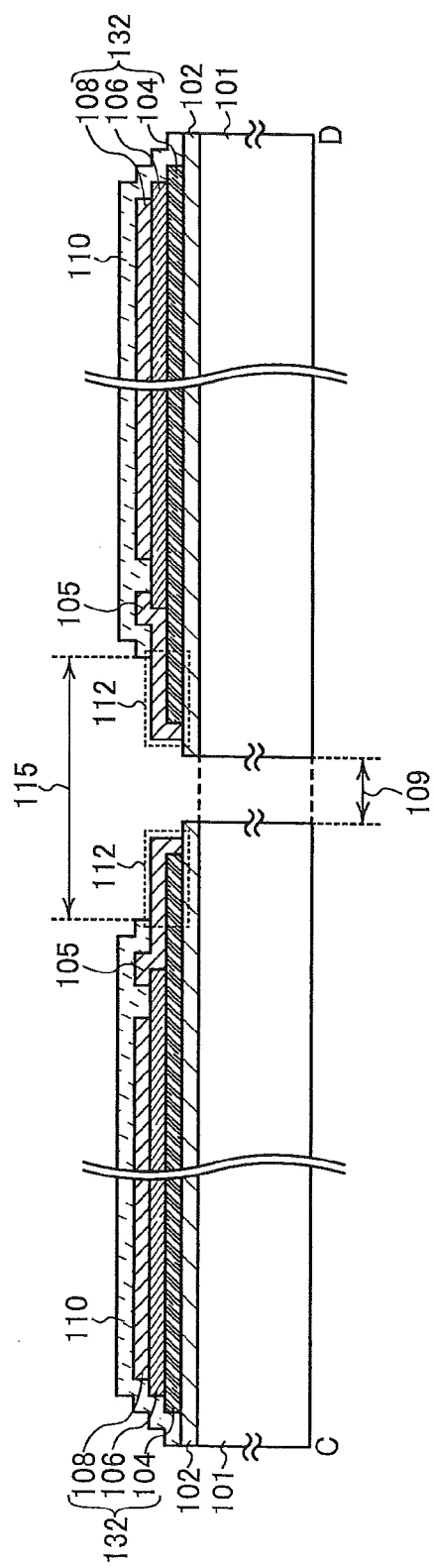

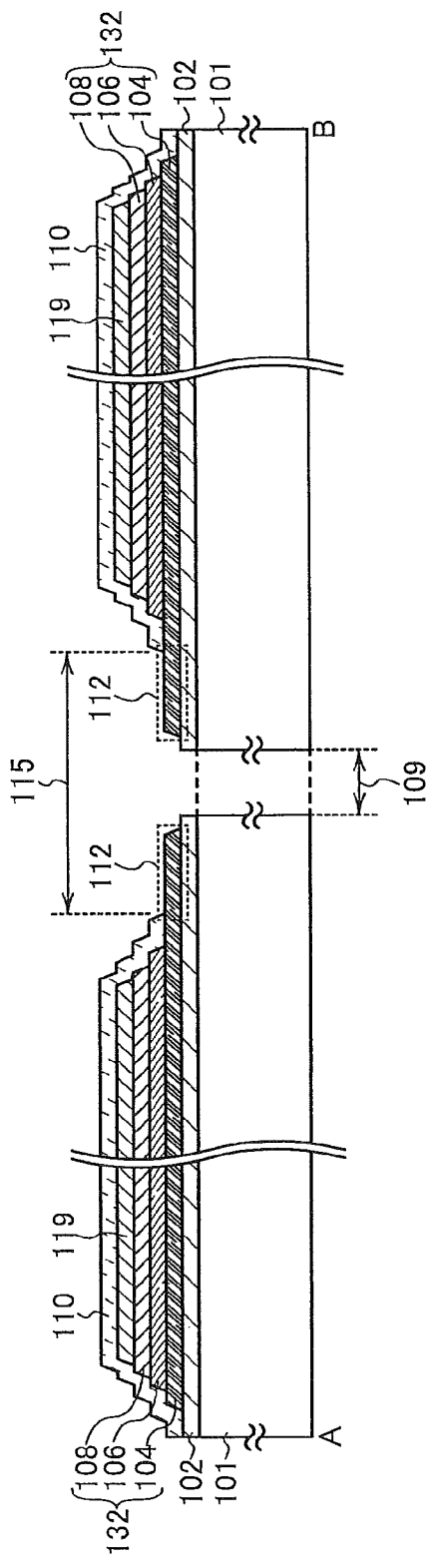
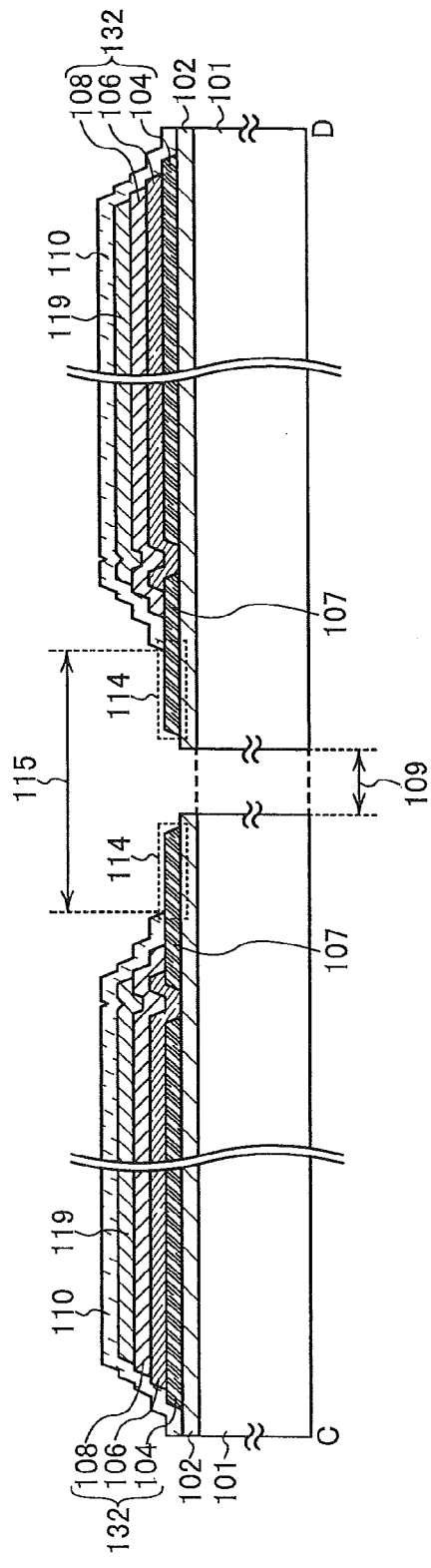

LIGHTING DEVICE

This application is a divisional of copending U.S. application Ser. No. 13/793,487, filed on Mar. 11, 2013 which is a divisional of U.S. application Ser. No. 12/723,040, filed on Mar. 12, 2010 (now U.S. Pat. No. 8,405,116 issued Mar. 26, 2013), which are all incorporated herein by reference.

BACKGROUND OF THE INVENTION

1. Field of the Invention

One embodiment of the present invention relates to a lighting device including a light-emitting member which exhibits electroluminescence.

2. Description of the Related Art

As a next-generation lighting device, a lighting device using an electroluminescent (EL) material has attracted attention. This is because a light source using an electroluminescent material is estimated to have higher emission efficiency than filament bulbs or fluorescent bulbs. In addition, when an electroluminescent material is deposited over a substrate by evaporation or coating, a planar light source with a reduced thickness can be manufactured resulting in an increase in the area of a light source. Accordingly, some inventions disclose a structure of a lighting device using an electroluminescent material, in which a light-emitting part has uniform emission intensity (for example, Patent Document 1).

Further, in order to reduce the load on an electroluminescent panel, a lighting device is disclosed in which an organic electroluminescent panel is formed into a ring shape to have an opening in its center (Patent Document 2). This lighting device has a structure in which a terminal is led from an electrode layer of the organic electroluminescent panel to the inner of the center opening so that the led terminal is connected to a driver circuit provided in a supporting member attached to the center part.

In the lighting device having such a structure, a metal plate, a conductive wire, or the like needs to be attached to a thin film electrode by soldering or the like in order to lead the terminal of the thin film electrode of the organic electroluminescent panel to the inner of the center opening. However, even when the metal plate or the conductive wire is attached to the thin film electrode, the thin film electrode has a problem in that it has low adhesion and thus is easily separated from a substrate.

There is also a problem in that the thin film electrode and the lead terminal such as the metal plate or the conductive wire need to be additionally provided, leading to an increase in the number of components and a complicated structure. This causes the following problem: reduction in the thickness of a lighting device cannot be achieved even though an electroluminescent element is a thin film; and a complicated structure increases cost.

REFERENCE

Patent Document

[Patent Document 1] Japanese Patent Laid-Open No. 2005-332773
[Patent Document 2] Japanese Patent Laid-Open No. 2007-173424

SUMMARY OF THE INVENTION

An object of one embodiment of the present invention is to reduce the thickness of a lighting device using an electroluminescent material. Another object of one embodiment of the present invention is to simplify the structure of a lighting device using an electroluminescent material to reduce cost.

According to one embodiment of the present invention, a light-emitting element having a stacked structure of a first electrode layer, an EL layer, and a second electrode layer is provided over a substrate having an opening in its center, and a first connecting portion and a second connecting portion for supplying electric power to the light-emitting element are provided in the center of the substrate (in the vicinity of the opening provided in the substrate).

One embodiment of the present invention provides a lighting device including: a substrate having an opening in its center; a light-emitting element having a stacked structure of a first electrode layer provided over the substrate, an EL layer, and a second electrode layer; an insulating film covering the light-emitting element and having an opening in the center of the substrate; a first connecting portion fowled by the first electrode layer led to the opening in the insulating film; and a second connecting portion formed by the second electrode layer led to the opening in the insulating film. The first connecting portion and the second connecting portion are provided over the substrate. Note that "leading the electrode layer to the opening in the insulating film" means that part of the electrode layer extends to the opening in the insulating film One embodiment of the present invention provides a lighting device including: a substrate having an opening in its center; a light-emitting element having a stacked structure of a first electrode layer provided over the substrate, an EL layer, and a second electrode layer; a conductive layer formed of the same material as the second electrode layer and electrically connected to the first electrode layer; an insulating film covering the light-emitting element and having an opening in the center of the substrate; and a first connecting portion and a second connecting portion provided over the substrate and formed in the opening in the insulating film. The first connecting portion is formed by the conductive layer provided in the opening in the insulating film, and the second connecting portion is formed by the second electrode layer led to the opening in the insulating film.

One embodiment of the present invention provides a lighting device including: a substrate having an opening in its center; a first electrode layer and a conductive layer provided over the substrate; an EL layer provided over the first electrode layer; a second electrode layer provided over the EL layer and electrically connected to the conductive layer; an insulating film covering the substrate, the first electrode layer, the EL layer, and the second electrode layer and having an opening in the center of the substrate; and a first connecting portion and a second connecting portion provided over the substrate and formed in the opening in the insulating film. The first connecting portion is formed by the first electrode layer led to the opening in the insulating film, and the second connecting portion is formed by the conductive layer provided in the opening in the insulating film. The first electrode layer can be formed of the same material as the conductive layer.

Note that in this specification, oxynitride refers to a substance that contains more oxygen atoms than nitrogen atoms and, nitride oxide refers to a substance that contains more nitrogen atoms than oxygen atoms. For example, a silicon oxynitride film refers to a film that contains more oxygen atoms than nitrogen atoms and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. On the other hand, a silicon nitride oxide film refers to a film that contains more nitrogen atoms than oxygen atoms and, in the case where measurements are performed using RBS and RFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

In this specification, the phrase "B is formed on A" or "B is formed over A" does not necessarily mean that B is formed on and in direct contact with A, but includes the case where B is not in direct contact with A, namely, the case where another object is provided between A and B.

According to one embodiment of the present invention, a lighting device has the following structure: a light-emitting element having a stacked structure of a first electrode layer, an EL layer, and a second electrode layer is provided over a substrate having an opening, and a first connecting portion electrically connected to the first electrode layer and a second connecting portion electrically connected to the second electrode layer are provided in the center of the substrate (in the vicinity of the opening), which makes it possible to reduce the thickness of the lighting device. According to one embodiment of the present invention, the first connecting portion and the second connecting portion provided over the substrate are formed of the same material as the first electrode layer or the second electrode layer, which results in a simplified structure and cost reduction.

BRIEF DESCRIPTION OF THE DRAWINGS

In the accompanying drawings: FIGS. 2A and 2B are diagrams illustrating an example of the lighting device of Embodiment 1;

FIGS. 4A and 4B are diagrams illustrating an example of the lighting device of Embodiment 1;

FIGS. 6A and 6B are diagrams illustrating an example of the lighting device of Embodiment 2;

FIGS. 9A and 9B are diagrams illustrating an example of the lighting device of Embodiment 3;

DETAILED DESCRIPTION OF THE INVENTION

Figure 1:
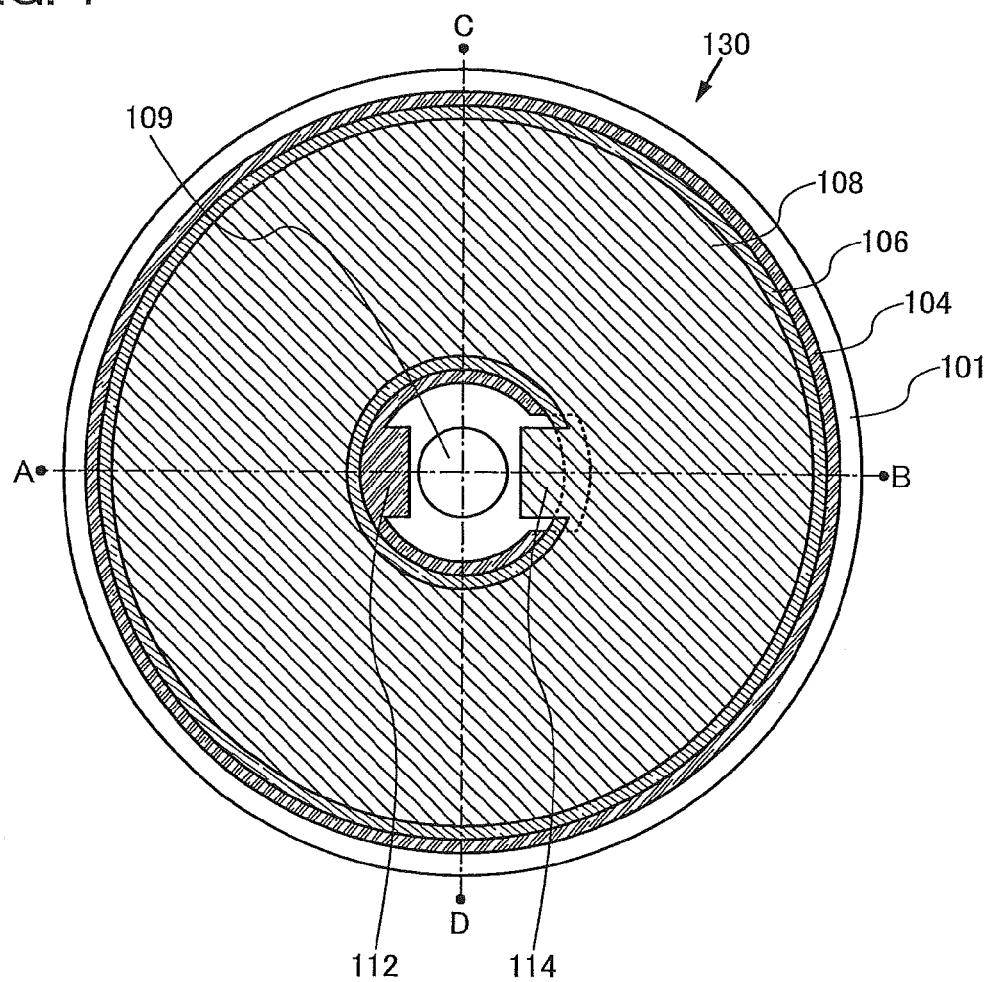
FIG. 1 is a diagram illustrating an example of a lighting device of Embodiment 1.

Embodiments of the invention will be described in detail below with reference to drawings. Note that the invention is not limited to the following embodiments, and it is apparent to those skilled in the art that modes and details can be modified in a wide variety of ways without departing from the spirit and scope of the invention. Accordingly, the invention should not be construed as being limited to the description of the embodiments given below. Further, structures of different embodiments can be implemented in combination as appropriate. Note that in the structures of the invention shown below, like portions or portions having a similar function are denoted by like reference numerals and the description thereof is not repeated.

(Embodiment 1)

In this embodiment, an example of a lighting device including an electroluminescent (EL) material will be described with reference to drawings.

In the lighting device shown in this embodiment, a first electrode layer, an EL layer, and a second electrode layer are stacked over a substrate having an opening in its center, and a first connecting portion and a second connecting portion are provided in the center of the substrate.

Hereinafter, a specific structure will be described with reference to FIG. 1 and FIGS. 2A and 2B. Note that FIG. 1 is a schematic plan view of the lighting device, FIG. 2A is a schematic cross-sectional view along line A-B of FIG. 1, and FIG. 2B is a schematic cross-sectional view along line C-D of FIG. 1.

A lighting device 130 illustrated in FIG. 1 and FIGS. 2A and 2B includes: a round-shaped (disk-shaped or circle-shaped) substrate 101 having an opening 109 in its center; a light-emitting element 132 provided over the substrate 101 with an insulating film 102 interposed therebetween; an insulating film 110 covering the light-emitting element 132; and a first connecting portion 112 and a second connecting portion 114 provided over the substrate 101.

The light-emitting element 132 has a stacked structure of a first electrode layer 104, an EL layer 106, and a second electrode layer 108; here, as an example, the first electrode layer 104 is formed over the substrate 101 with the insulating film 102 interposed therebetween, the EL layer 106 is formed over the first electrode layer 104, and the second electrode layer 108 is formed over the EL layer 106.

The insulating film 110 has an opening 115 in the center of the substrate 101, and the first connecting portion 112 and the second connecting portion 114 are provided in the opening 115. Note that the opening 115 in the insulating film 110 is formed to have an area (the area of the opening in a surface parallel to the surface of the substrate 101) larger than that of the opening 109 in the substrate 101.

The first connecting portion 112 is formed by the first electrode layer 104 led (extending) to the opening 115, and the second connecting portion 114 is formed by the second electrode layer 108 led to the opening 115. In other words, part of the first electrode layer 104 is led (extends) to the opening 115 in the insulating film 110, thereby forming the first connecting portion 112, and part of the second electrode layer 108 is led (extends) to the opening 115 in the insulating film 110, thereby forming the second connecting portion 114.

When the first connecting portion 112 and the second connecting portion 114 are formed over the substrate 101 by thus leading the first electrode layer 104 and the second electrode layer 108 formed over the substrate 101, the thickness of the lighting device can be reduced.

In addition, by using the first electrode layer 104 and the second electrode layer 108 formed over the substrate 101 as the first connecting portion 112 and the second connecting portion 114, the structure of the lighting device can be simplified and cost reduction can be achieved.

Furthermore, when the substrate 101 having the opening 109 is used and the first connecting portion 112 and the second connecting portion 114 are provided in the center of the substrate 101 (more specifically, in the vicinity of the opening 109), electric power can be supplied from the outside through the opening 109 formed in the substrate 101. As a result, in the lighting device, electric power can be supplied to the light-emitting element 132 through one portion (the center of the substrate).

In the structure illustrated in FIG. 1 and FIGS. 2A and 2B, the first electrode layer 104, the EL layer 106, and the second electrode layer 108, as well as the insulating film 110, have an opening in the center of the substrate. Then, part of the second electrode layer 108 is led to the opening in the first electrode layer 104, the EL layer 106, and the insulating film 110, whereby the second connecting portion 114 is provided over the substrate 101. In that case, in a region where the part of the second electrode layer 108 passes (crosses) over an end portion of the first electrode layer 104 and an end portion of the EL layer 106, the EL layer 106 can be provided to cover the end portion of the first electrode layer 104 so that the first electrode layer 104 does not touch the second electrode layer 108.

FIG. 1 and FIGS. 2A and 2B illustrate the structure in which the EL layer 106 is formed inside the first electrode layer 104 and the second electrode layer 108 is formed inside the EL layer 106 on the periphery of the substrate 101. However, the present invention is not limited to this structure, and any structure may be employed as long as the first electrode layer 104 is insulated from the second electrode layer 108.

For example, on the periphery of the substrate 101, the EL layer 106 may be formed to cover the end portion of the first electrode layer 104 and the second electrode layer 108 may be formed to cover the end portion of the EL layer 106. In that case, on the periphery of the substrate 101, the El layer 106 is formed inside the second electrode layer 108 and the first electrode layer 104 is formed inside the EL layer 106.

Alternatively, on the periphery of the substrate 101, the EL layer 106 may be formed to cover the end portion of the first electrode layer 104 and the second electrode layer 108 may be provided so as not to pass over the end portion of the EL layer 106. In that case, on the periphery of the substrate 101, the first electrode layer 104 and the second electrode layer 108 are fowled inside the EL layer 106.

Next, materials and the like of the above lighting device illustrated in FIG. 1 and FIGS. 2A and 2B will be described specifically.

<Substrate 101>

As the substrate 101, it is possible to use a round-shaped (disk-shaped or circle-shaped) member having the opening 109, over which a thin film can be deposited or a thin film has been deposited. Specifically, a glass substrate, a ceramic substrate, a quartz substrate, or the like can be used. Alternatively, a plastic substrate made of polycarbonate, polyarylate, polyether sulfone, or the like can be used. Further alternatively, a film (made of polypropylene, polyester, vinyl, polyvinyl fluoride, vinyl chloride, or the like), or an inorganic film formed by evaporation can be used.

A flexible substrate may also be used as the substrate 101. The flexible substrate means a substrate which can be bent. It is also possible to use a substrate in which an insulating film is provided over a surface of a metal substrate such as a stainless steel alloy substrate. Any other substrate can also be used as long as it functions as a support in a manufacturing process of the lighting device 130.

In the case where light is emitted from the light-emitting element 132 to the substrate 101 side, the substrate 101 is made of a material which transmits visible light.

The size of the substrate 101 can be determined as appropriate depending on the application of the lighting device 130. As an example, it is preferable that the substrate 101 have about the same size as an optical disk device such as a CD-R, because the lighting device is easily handled or the productivity thereof is increased. For example, it is possible to use a circular plastic substrate which has a diameter of 10 cm to 14 cm, e.g., 12 cm, and a thickness of about 1.2 mm to 1.5 mm. In addition, a support with a thickness of 0.5 mm to 0.7 mm may be bonded to the substrate 101. The opening 109 in the substrate 101 can be formed to a diameter of 5 mm to 20 mm (e.g., 15 mm).

By using such a substrate, a circular lighting device having an opening in its center and having a diameter of 10 cm to 14 cm (e.g., 12 cm) and a thickness of about 1.2 mm to 2.0 mm can be manufactured. Note that the size of the lighting device is not limited to this example.

Although this embodiment shows the case where the substrate 101 has a circular shape, the shape of the substrate 101 is not limited to a circle and may be elliptical or rectangular. Further, the shape of the opening 109 formed in the substrate 101 is not limited to a circle, and may be elliptical or rectangular.

<Insulating film 102>

The insulating film 102 serves as a protective film (a base insulating film) for preventing diffusion of moisture or impurity elements from the substrate 101 into the light-emitting element 132. In particular, the use of plastic for the substrate 101 makes it possible to reduce the diffusion of moisture from the substrate 101 into the light-emitting element 132.

Examples of the insulating film 102 include a silicon oxide film, a silicon nitride film, a silicon oxynitride film, a silicon nitride oxide film, an aluminum oxide film, an aluminum nitride film, a magnesium oxide film, an yttrium oxide film, a hafnium oxide film, a tantalum oxide film, a zinc sulfide film, and a zinc sulfide film containing silicon oxide. The insulating film 102 may have a single-layer structure or a multi-layer structure of any of these films. These films can be formed by CVD, sputtering, or the like.

The insulating film 102 may be a single layer or stacked layers of two or more insulating films The insulating film 102 is not necessarily provided, and the first electrode layer 104 may be formed on and in contact with the substrate 101.

<First Electrode Layer 104, Second Electrode Layer 108>

The first electrode layer 104 and the second electrode layer 108 serve as electrodes of the light-emitting element 132, and can be formed using conductive films One of the first electrode layer 104 and the second electrode layer 108 serves as an anode of the light-emitting element 132 and the other serves as a cathode of the light-emitting element 132. The first electrode layer 104 may be used as the anode while the second electrode layer 108 is used as the cathode, or the first electrode layer 104 may be used as the cathode while the second electrode layer 108 is used as the anode.

One of the first electrode layer 104 and the second electrode layer 108, which is used as the anode, is preferably made of a substance having a high work function. Specifically, the electrode layer used as the anode can be formed with a single layer or stacked layers of gold (Au), platinum (Pt), nickel (Ni), tungsten (W), chromium (Cr), molybdenum (Mo), iron (Fe), cobalt (Co), copper (Cu), palladium (Pd), or the like, as well as indium tin oxide (ITO), indium tin oxide containing silicon oxide (ITSO), or indium oxide containing 2 wt % to 20 wt % zinc oxide (IZO).

The other of the first electrode layer 104 and the second electrode layer 108, which is used as the cathode, is preferably made of a substance having a low work function. Specifically, the electrode layer used as the cathode can be formed with a single layer or stacked layers of an alkali metal such as lithium (Li) or cesium (Cs), an alkaline earth metal such as magnesium (Mg) or calcium (Ca), or a rare earth metal such as erbium (Er) or ytterbium (Yb), as well as aluminum (Al) or indium (In). The electrode layer can also be made of an alloy such as aluminum-lithium alloy (AlLi) or magnesium-silver alloy (MgAg).

The first electrode layer 104 and the second electrode layer 108 can be formed by a deposition method such as sputtering or evaporation using a shadow mask.

In this embodiment, for example, the first electrode layer 104 can be made of ITO to serve as the anode, and the second electrode layer 108 can be made of aluminum to serve as the cathode.

Light is emitted from the light-emitting element 132 to the outside through one or both of the first electrode layer 104 and the second electrode layer 108. Accordingly, one or both of the first electrode layer 104 and the second electrode layer 108 is formed as a light-transmitting electrode. In the case where only the first electrode layer 104 is a light-transmitting electrode, light is emitted to the substrate 101 side through the first electrode layer 104. In the case where only the second electrode layer 108 is a light-transmitting electrode, light is emitted to the insulating film 110 side through the second electrode layer 108. In the case where both the first electrode layer 104 and the second electrode layer 108 are light-transmitting electrodes, light is emitted to the substrate 101 side and the insulating film 110 side through the first electrode layer 104 and the second electrode layer 108, respectively.

<EL Layer 106>

The EL layer 106 includes at least, a layer containing a light-emitting substance, and can have a single-layer structure or a stacked structure of plural films.

For example, when a voltage is applied to the light-emitting element 132 with the first electrode layer 104 and the second electrode layer 108 used as the anode and the cathode, respectively, holes injected from the first electrode layer 104 side and electrons injected from the second electrode layer 108 side are transferred. Then, the electrons and the holes are recombined in the EL layer 106 to excite a light-emitting substance, so that the excited light-emitting substance emits light when returning to the ground state. Thus, the light-emitting element 132 performs its function. Such a light-emitting element 132 (an electroluminescent element) can be used for the lighting device 130 shown in this embodiment.

<Insulating Film 110>

The insulating film 110 protects the light-emitting element 132 and serves as a sealing film to prevent intrusion of oxygen or moisture into the light-emitting element 132. The insulating film 110 can be formed with a single layer or stacked layers of an inorganic material film such as a silicon oxide film, a silicon nitride film, a silicon oxynitride film, an aluminum nitride film, an aluminum oxide film, an aluminum nitride film, a magnesium oxide film, an yttrium oxide film, a hafnium oxide film, a tantalum oxide film, a zinc sulfide film, or a zinc sulfide film containing silicon oxide. Alternatively, a thin film containing carbon as its main component (e.g., a DLC film or a CN film) may be used.

Further alternatively, the insulating film 110 may be made of a photosensitive or non-photosensitive organic material such as polyimide, acrylic, polyamide, resist, or benzocyclobutene, or a heat-resistant organic resin such as siloxane. The insulating film 110 may also be Bawled with stacked layers of an inorganic material film and an organic material film.

In the case where light is emitted from the light-emitting element 132 to the insulating film 110 side, the insulating film 110 is made of a material which transmits visible light. Examples of the material transmitting visible light include $CaF_2$, $MgF_2$, and $BaF_2$. $CaF_2$, $MgF_2$, or $BaF_2$ can be deposited by evaporation, which makes it possible to reduce damage to the light-emitting element 132 during deposition.

The opening in the insulating film 110 can be formed using a shadow mask.

<First Connecting Portion 112, Second Connecting Portion 114>

The first connecting portion 112 and the second connecting portion 114 serve as terminals for electrical connection to external wirings and the like. That is, electric power is supplied from the outside to the first electrode layer 104 and the second electrode layer 108 through the first connecting portion 112 and the second connecting portion 114, whereby the light-emitting element 132 emits light.

<Modified Example>

The above FIG. 1 illustrates the case where the first connecting portion 112 formed by the first electrode layer 104 faces the second connecting portion 114 formed by the second electrode layer 108, though the present invention is not limited to that case. The first connecting portion 112 and the second connecting portion 114 may be provided at least in the opening 115 in the insulating film 110.

Figure 3:
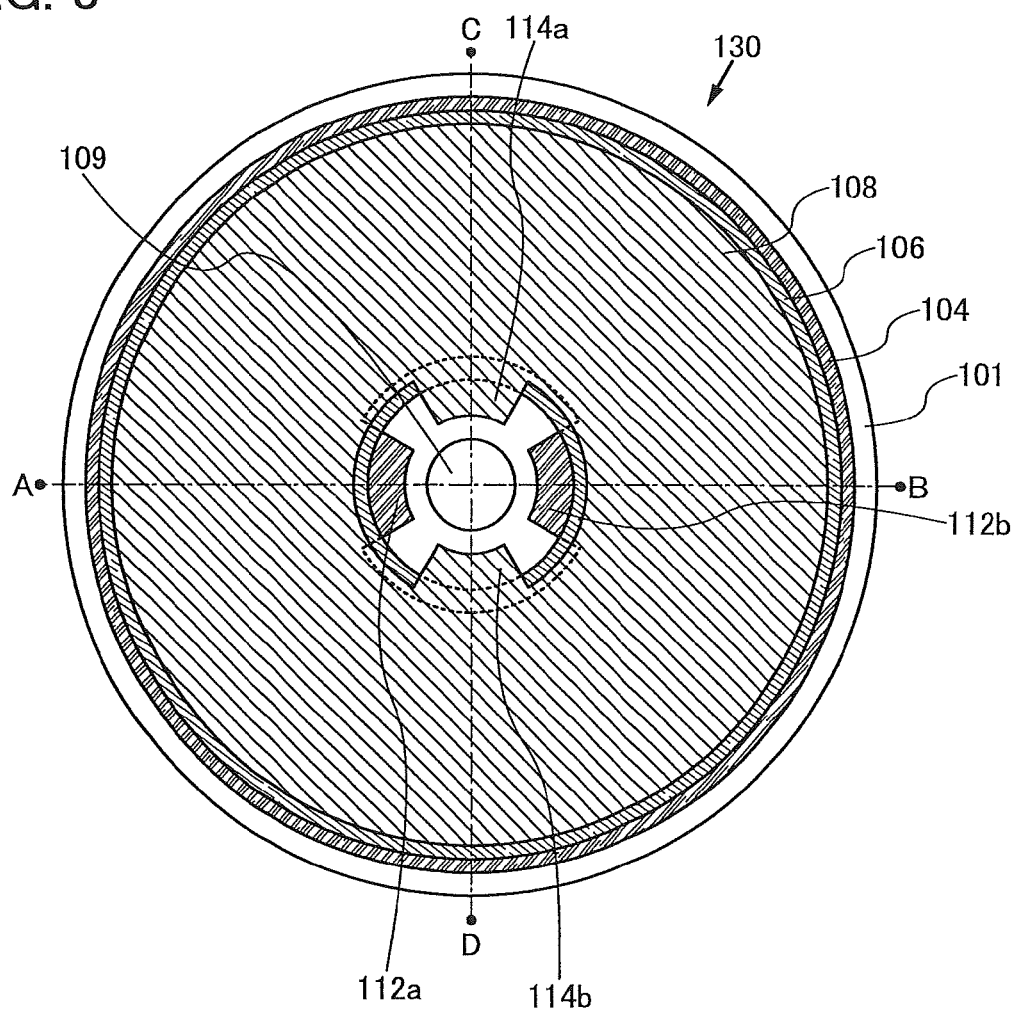
FIG. 3 is a diagram illustrating an example of the lighting device of Embodiment 1.

Further, the number of the first connecting portion 112 and the number of the second connecting portion 114 each may be two or more. For example, as illustrated in FIG. 3 and FIGS. 4A and 4B, two first connecting portions (here, first connecting portions 112a and 112b) and two second connecting portions (here, second connecting portions 114a and 114b) may be provided. Such a plurality of first connecting portions and second connecting portions make a good electrical connection with wirings and the like.

Note that FIG. 3 is a schematic plan view of the lighting device, FIG. 4A is a schematic cross-sectional view along line A-B of FIG. 3, and FIG. 4B is a schematic cross-sectional view along line C-D of FIG. 3.

FIG. 3 and FIGS. 4A and 4B illustrate the case where the first connecting portions 112a and 112b face each other and the second connecting portions 114a and 114b face each other. Alternatively, the first connecting portions may be provided to face the respective second connecting portions (the first connecting portion 112a faces the second connective portion 114a and the first connecting portion 112b faces the second connecting portion 114b).

What is described in this embodiment with reference to each drawing can be freely combined with or replaced with what is described in other embodiments as appropriate.

(Embodiment 2)

Figure 5:
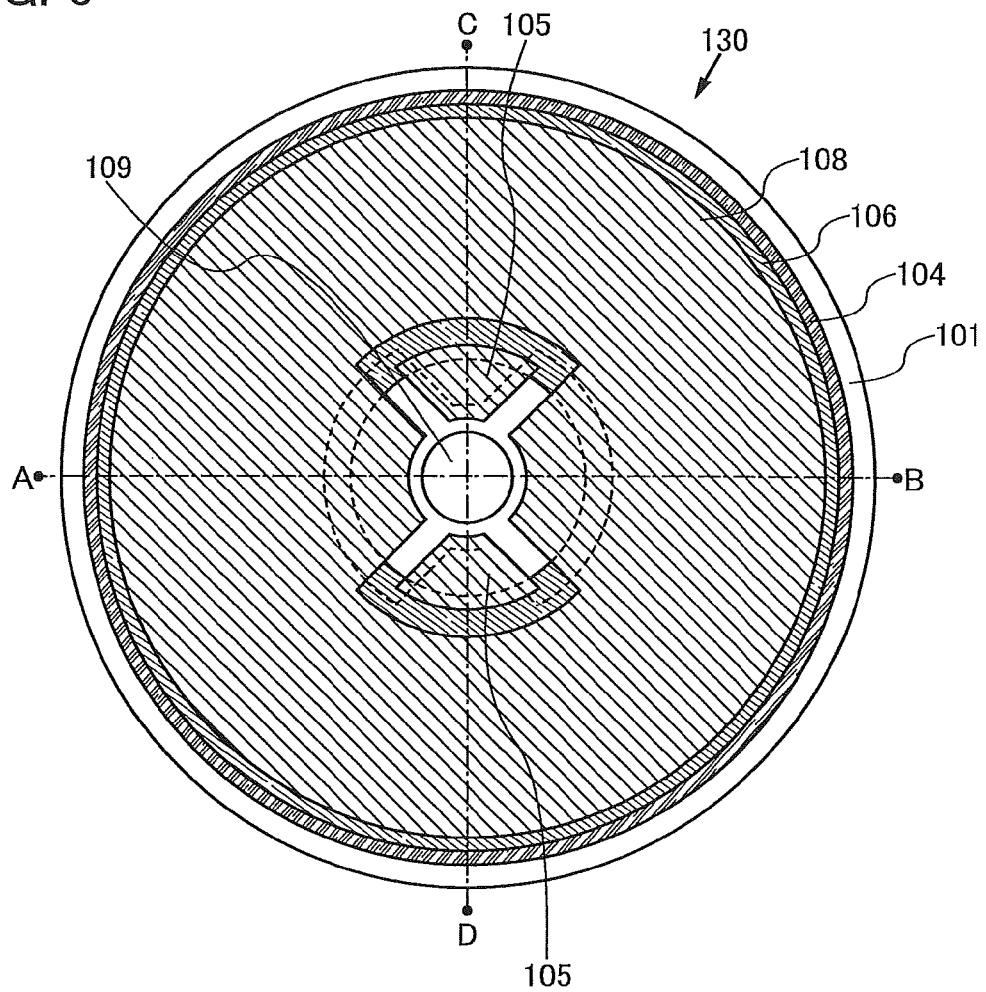
FIG. 5 is a diagram illustrating an example of a lighting device of Embodiment 2.

In this embodiment, another example of a lighting device which is different from that shown in the above embodiment will be described with reference to FIG. 5 and FIGS. 6A and 6B. FIG. 5 is a schematic plan view of the lighting device, FIG. 6A is a schematic cross-sectional view along line A-B of FIG. 5, and FIG. 6B is a schematic cross-sectional view along line C-D of FIG. 5.

A large part of the manufacturing process (such as materials that can be used) in this embodiment is the same as that shown in above Embodiment 1. Accordingly, different points will be described in detail below, and the description on the same point will be omitted.

The lighting device 130 illustrated in FIG. 5 and FIGS. 6A and 6B includes: the round-shaped (disk-shaped or circle-shaped) substrate 101 having the opening 109 in its center; the first electrode layer 104 provided over the substrate 101 with the insulating film 102 interposed therebetween; the EL layer 106 provided over the first electrode layer 104; the second electrode layer 108 provided over the EL layer 106; a conductive layer 105 electrically connected to the first electrode layer 104; the insulating film 110 covering the first electrode layer 104, the EL layer 106, and the second electrode layer 108; and the first connecting portions 112 and the second connecting portions 114 provided over the substrate 101.

The insulating film 110 has the opening 115 in the center of the substrate 101, and the first connecting portions 112 and the second connecting portions 114 are provided in the opening 115. Note that the opening 115 in the insulating film 110 is formed to be larger than the opening 109 in the substrate 101.

The first connecting portions 112 are formed by the conductive layer 105 provided in the opening 115 in the insulating film 110, and the second connecting portions 114 are formed by the second electrode layer 108 led to the opening 115 in the insulating film 110.

When the first connecting portions 112 and the second connecting portions 114 are thus formed over the substrate 101 by using the conductive layer 105 and the second electrode layer 108 formed over the substrate 101, the thickness of the lighting device can be reduced.

In addition, by using the conductive layer 105 and the second electrode layer 108 formed over the substrate 101 for the first connecting portions 112 and the second connecting portions 114, the structure of the lighting device can be simplified and cost reduction can be achieved.

The conductive layer 105 can be made of the same material (in the same process) as the second electrode layer 108. In that case, the first connecting portions 112 and the second connecting portions 114 can be made of the same material, resulting in a reduction in the variation in contact resistance and the like due to a difference in material between the first connecting portions 112 and the second connecting portions 114. Furthermore, it becomes easy to select a bonding material, such as solder, for electrical connection between the first connecting portions 112 and the second connecting portions 114.

FIG. 5 and FIGS. 6A and 6B illustrate the case where part of the conductive layer 105 is provided over the EL layer 106 and in contact with the first electrode layer 104 led to the opening 115 in the insulating film 110, though the present invention is not limited to that case. The first electrode layer 104 is not necessarily provided in the opening 115 in the insulating film 110, and only the conductive layer 105 electrically connected to the first electrode layer 104 may be provided in the opening 115 in the insulating film 110.

Further, FIG. 5 and FIGS. 6A and 6B illustrate the case where a plurality of first connecting portions 112 formed by the conductive layer 105 and a plurality of second connecting portions 114 formed by the second electrode layer 108 are provided, though the present invention is not limited to that case. One first connecting portion 112 and one second connecting portion 114 may be provided as illustrated in FIG. 1. When a plurality of first connecting portions 112 formed by the conductive layer 105 and a plurality of second connecting portions 114 formed by the second electrode layer 108 are provided, the positions thereof can be freely determined What is described in this embodiment with reference to each drawing can be freely combined with or replaced with what is described in other embodiments as appropriate.

(Embodiment 3)

Figure 7:
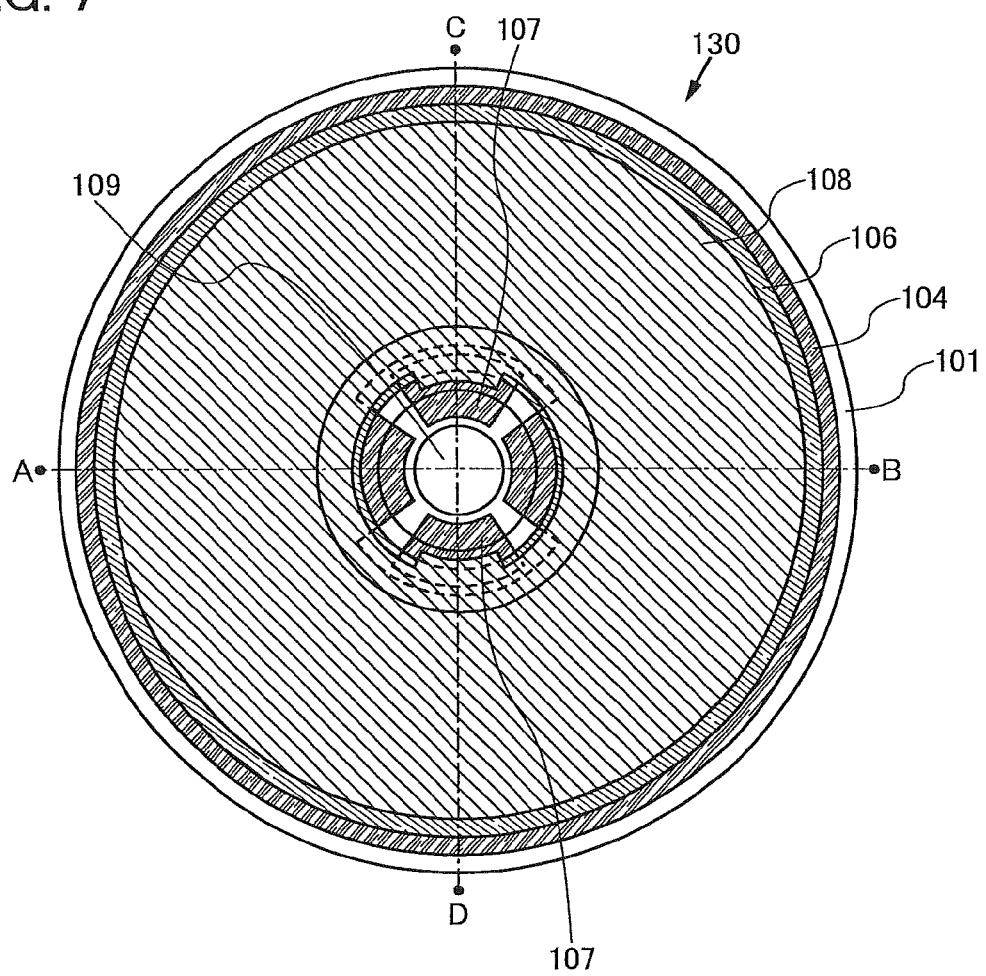
FIG. 7 is a diagram illustrating an example of a lighting device of Embodiment 3.

In this embodiment, another example of a lighting device which is different from those shown in the above embodiments will be described with reference to FIG. 7 and FIGS. 8A and 8B. FIG. 7 is a schematic plan view of the lighting device, FIG. 8A is a schematic cross-sectional view along line A-B of FIG. 7, and FIG. 8B is a schematic cross-sectional view along line C-D of FIG. 7.

A large part of the manufacturing process (such as materials that can be used) in this embodiment is the same as that shown in above Embodiment 1. Accordingly, different points will be described in detail below, and the description on the same point will be omitted.

Figure 8A:
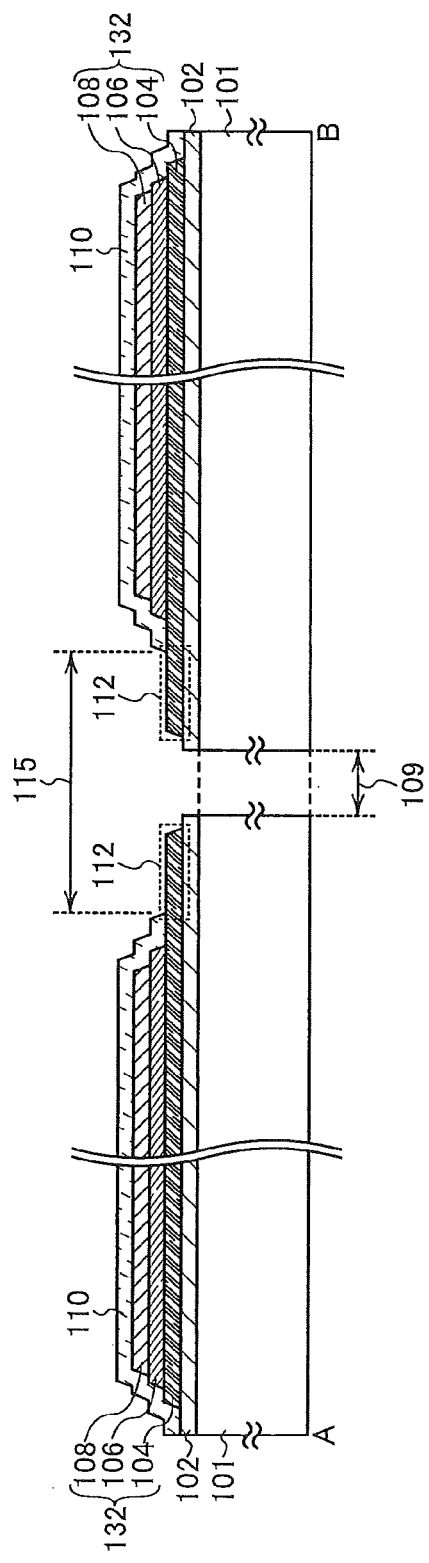
FIGS. 8A and 8B are diagrams illustrating an example of the lighting device of Embodiment 3.
Figure 8B:
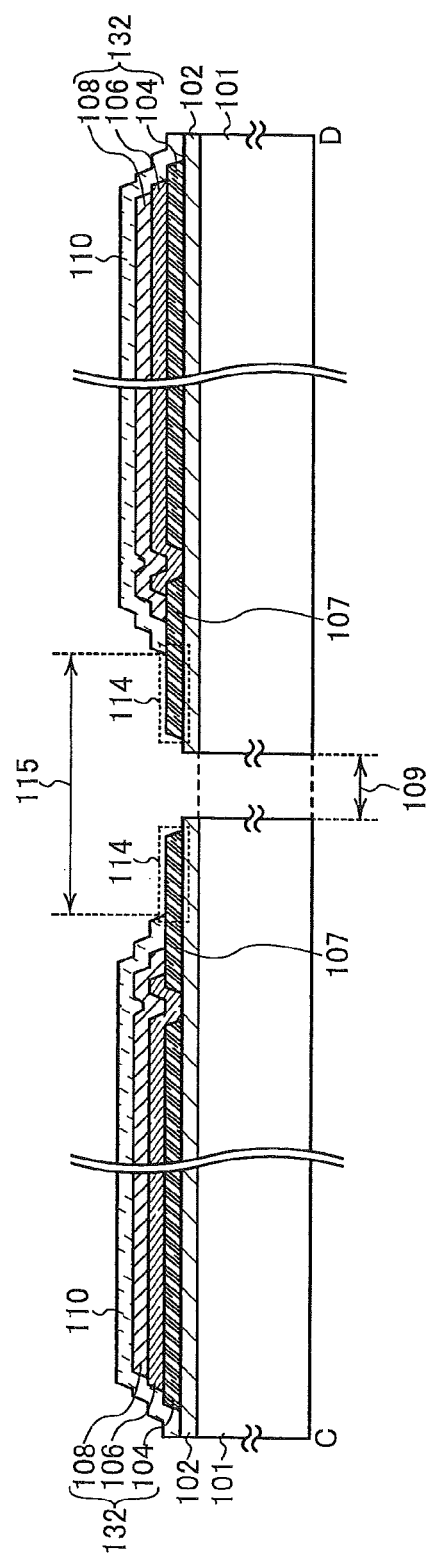

The lighting device 130 illustrated in FIG. 7 and FIGS. 8A and 8B includes: the round-shaped (disk-shaped or circle-shaped) substrate 101 having the opening 109 in its center; the first electrode layer 104 and a conductive layer 107 provided over the substrate 101 with the insulating film 102 interposed therebetween; the EL layer 106 provided over the first electrode layer 104; the second electrode layer 108 provided over the EL layer 106 and electrically connected to the conductive layer 107; the insulating film 110 covering the first electrode layer 104, the EL layer 106, and the second electrode layer 108; and the first connecting portions 112 and the second connecting portions 114 provided over the substrate 101.

The insulating film 110 has the opening 115 in the center of the substrate 101, and the first connecting portions 112 and the second connecting portions 114 are provided in the opening 115. Note that the opening 115 in the insulating film 110 is formed to be larger than the opening 109 in the substrate 101.

The first connecting portions 112 are formed by the first electrode layer 104 led to the opening 115 in the insulating film 110, and the second connecting portions 114 are formed by the conductive layer 107 formed in the opening 115 in the insulating film 110.

When the first connecting portions 112 and the second connecting portions 114 are thus formed over the substrate 101 by using the first electrode layer 104 and the conductive layer 107 formed over the substrate 101, the thickness of the lighting device can be reduced.

In addition, by using the first electrode layer 104 and the conductive layer 107 formed over the substrate 101 for the first connecting portions 112 and the second connecting portions 114, the structure of the lighting device can be simplified and cost reduction can be achieved.

The conductive layer 107 can be made of the same material (in the same process) as the first electrode layer 104. In that case, the first connecting portions 112 and the second connecting portions 114 can be made of the same material, resulting in a reduction in the variation in contact resistance and the like due to a difference in material between the first connecting portions 112 and the second connecting portions 114. Furthermore, it becomes easy to select a bonding material, such as solder, for electrical connection between the first connecting portions 112 and the second connecting portions 114.

In the structure illustrated in FIG. 7 and FIGS. 8A and 8B, part of the second electrode layer 108 crosses the end portion of the first electrode layer 104 covered with the EL layer 106 and is electrically connected to the second connecting portions 114. In that case, the EL layer 106 covering the end portion of the first electrode layer 104 prevents a direct contact between the first electrode layer 104 and the second electrode layer 108.

FIG. 7 and FIGS. 8A and 8B illustrate the case where part of the conductive layer 107 is provided under and in contact with the EL layer 106, though the present invention is not limited to that case. The conductive layer 107 may be provided so as not to touch the EL layer 106.

Further, FIG. 7 and FIGS. 8A and 8B illustrate the case where a plurality of first connecting portions 112 formed by the first electrode layer 104 and a plurality of second connecting portions 114 formed by the conductive layer 107 are provided, though the present invention is not limited to that case. One first connecting portion 112 and one second connecting portion 114 may be provided as illustrated in FIG. 1. When a plurality of first connecting portions 112 formed by the first electrode layer 104 and a plurality of second connecting portions 114 formed by the second electrode layer 108 are provided, the positions thereof can be freely determined.

FIGS. 9A and 9B illustrate a structure where a desiccant layer 119 is formed between the light-emitting element 132 and the insulating film 110. In that case, the desiccant layer 119 removes a small amount of moisture remaining in the region covered with the insulating film 110; therefore, the light-emitting element 132 can be kept dry, resulting in an increase in the reliability of the lighting device 130.

The desiccant layer 119 is preferably made of a substance that adsorbs water ($H_2O$) by chemical adsorption, e.g., an oxide of an alkaline earth metal such as calcium oxide (CaO) or barium oxide (BaO). Note that the material of the desiccant layer 119 is not limited to such a substance, and a substance that adsorbs water by physical adsorption, e.g., zeolite or silica gel, may also be used. The desiccant layer 119 can be formed by a deposition method such as sputtering or evaporation using a shadow mask. Alternatively, the desiccant layer 119 may be fowled by applying a resin in which a desiccant is dispersed.

The total thickness of the light-emitting element 132 and the desiccant layer 119 is 1 μm to 10 μm, though it depends on the thickness of the desiccant layer 119. In the case where the second electrode layer and the desiccant layer 119 are made of a material which transmits visible light, light can be emitted to the insulating film 110 side and the desiccant layer 119 can also serve as an anti-reflection film. In the case where the desiccant layer 119 is made of an opaque material, light can be emitted to the substrate 101 side by using a material which transmits visible light for the substrate 101 and the first electrode layer 104.

As in the above FIGS. 9A and 9B, the desiccant layer 119 may be provided between the light-emitting element 132 and the insulating film 110 also in the above structures illustrated in FIG. 1, FIGS. 2A and 2B, FIG. 3, FIGS. 4A and 4B, FIG. 5, and FIGS. 6A and 6B.

What is described in this embodiment with reference to each drawing can be freely combined with or replaced with what is described in other embodiments as appropriate.

(Embodiment 4)

In this embodiment, an example of an element structure of the light-emitting element 132 provided in the lighting device 130 shown in the above embodiments will be described with reference to FIGS. 14A and 14B.

Figure 14A:
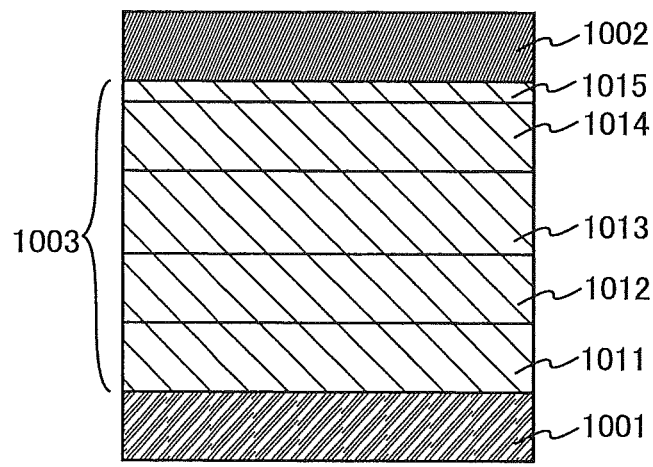
FIGS. 14A and 14B are diagrams each illustrating an example of a light-emitting element in a lighting device.

In an element structure illustrated in FIG. 14A, an EL layer 1003 including a light-emitting region is sandwiched between a pair of electrodes (an anode 1001 and a cathode 1002). Note that in FIGS. 14A and 14B, the anode 1001 and the cathode 1002 correspond to either the first electrode layer 104 or the second electrode layer 108 illustrated in the above FIG. 1, FIGS. 2A and 2B, FIG. 3, FIGS. 4A and 4B, FIG. 5, FIGS. 6A and 6B, FIG. 7, FIGS. 8A and 8B, and FIGS. 9A and 9B.

The EL layer 1003 includes at least a light-emitting layer 1013, and may have a stacked structure including a functional layer in addition to the light-emitting layer 1013. Examples of the functional layer other than the light-emitting layer 1013 include a layer containing a substance having a high hole-injecting property, a substance having a high hole-transporting property, a substance having a high electron-transporting property, a substance having a high electron-injecting property, a bipolar substance (a substance having high electron and hole transporting properties), or the like. Specifically, functional layers such as a hole-injecting layer 1011, a hole-transporting layer 1012, a light-emitting layer 1013, an electron-transporting layer 1014, and an electron-injecting layer 1015 can be used in combination as appropriate.

Next, materials that can be used for the aforementioned light-emitting element will be specifically described.

The anode 1001 is preferably made of a metal, an alloy, a conductive compound, a mixture thereof, or the like that has a high work function (specifically, a work function of 4.0 eV or higher). Specifically, it is possible to use, for example, indium oxide-tin oxide (ITO: indium tin oxide), indium oxide-tin oxide containing silicon or silicon oxide, indium oxide-zinc oxide (IZO: indium zinc oxide), or indium oxide containing tungsten oxide and zinc oxide.

These conductive metal oxide films are generally deposited by sputtering, but may also be formed by application of a sol-gel method or the like. For example, a film of indium oxide-zinc oxide (IZO) can be formed by sputtering using a target in which 1 wt % to 20 wt % of zinc oxide is added to indium oxide. Further, a film of indium oxide containing tungsten oxide and zinc oxide can be formed by sputtering using a target in which 0.5 wt % to 5 wt % of tungsten oxide and 0.1 wt % to 1 wt % of zinc oxide are added to indium oxide.

Besides, it is also possible to use gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (such as titanium nitride), molybdenum oxide, vanadium oxide, ruthenium oxide, tungsten oxide, manganese oxide, titanium oxide, or the like.

The cathode 1002 can be made of a metal, an alloy, a conductive compound, a mixture thereof, or the like that has a low work function (specifically, a work function of 3.8 eV or lower). Specific examples of the material for the cathode 1002 include an element belonging to Group 1 or Group 2 of the periodic table, i.e., an alkali metal such as lithium (Li) or cesium (Cs), an alkaline earth metal such as magnesium (Mg), calcium (Ca), or strontium (Sr), and an alloy containing these elements (e.g., MgAg or AlLi); and a rare earth metal such as europium (Eu) or ytterbium (Yb), and an alloy thereof. A film of an alkali metal, an alkaline earth metal, or an alloy containing such a metal can be formed by vacuum evaporation. An alloy film containing an alkali metal or an alkaline earth metal can also be formed by sputtering. Alternatively, silver paste or the like can be deposited by ink jet or the like.

Alternatively, the cathode 1002 can be formed by a stack of a thin film of an alkali metal compound, an alkaline earth metal compound, or a rare earth metal compound (e.g., lithium fluoride (LiF), lithium oxide ($LiO_x$), cesium fluoride (CsF), calcium fluoride ($CaF_2$), or erbium fluoride ($ErF_3$)) and a film of a metal such as aluminum.

In the light-emitting element shown in this embodiment, at least one of the anode 1001 and the cathode 1002 may have light-transmitting properties.

Next, specific examples of the material used for each layer of the EL layer 1003 will be described below.

The hole-injecting layer 1011 is a layer containing a substance with a high hole-injecting property. As the substance with a high hole-injecting property, for example, molybdenum oxide, vanadium oxide, ruthenium oxide, tungsten oxide, or manganese oxide can be used. Alternatively, the hole-injecting layer 1011 can be made of a phthalocyanine-based compound such as phthalocyanine (abbreviation: $H_2Pc$) or copper phthalocyanine (abbreviation: CuPc); an aromatic amine compound such as 4,4'-bis[N-(4-diphenylaminophenyl)-N-phenylamino]biphenyl (abbreviation: DPAB) or N,N'-bis[4-[bis(3-methylphenyl)amino]phenyl]-NN'-diphenyl-[1,1'-biphenyl]-4,4'-diamine (abbreviation: DNTPD); a high molecular compound such as poly(3,4-ethylenedioxythiophene)/poly(styrenesulfonic acid) (PEDOT/PSS); or the like. Further alternatively, the hole-injecting layer 1011 can be made of a tris(p-enamine-substituted-aminophenyl)amine compound, a 2,7-diamino-9-fluorenylidene compound, a tri(p-N-enamine-substituted-aminophenyl) benzene compound, a pyrene compound having one or two ethenyl groups having at least one aryl group, N,N'-di(biphenyl-4-yl)-N,N'-diphenylbiphenyl-4,4'-diamine, N,N,N',N'-tetra(biphenyl-4-yl)biphenyl-4,4'-diamine, N,N,N',N'-tetra(biphenyl-4-yl)-3,3'-diethylbiphenyl-4,4'-diamine, 2,2'-(methylenedi-4,1-phenylene)bis[4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3 -dimethylbiphenyl-4,4'-diyl)bis(4,5-diphenyl-2H-1,2,3-triazole), bis[4-(4,5-diphenyl-2H-1,2,3-triazol-2-yl)phenyl](methyl)amine, or the like.

The hole-injecting layer 1011 can also be fanned of a hole-injecting composite material including an organic compound and an inorganic compound (preferably, an inorganic compound having electron-accepting properties to an organic compound). Since electrons are transferred between the organic compound and the inorganic compound, the hole-injecting composite material has a high carrier density, and thus has excellent hole-injecting properties and hole-transporting properties.

In the case where the hole-injecting layer 1011 is made of a hole-injecting composite material, the hole-injecting layer 1011 can form an ohmic contact with the anode 1001; thus, the material of the anode 1001 can be selected regardless of the work function.

The inorganic compound used for the hole-injecting composite material is preferably an oxide of a transition metal. Further, an oxide of metals belonging to Group 4 to Group 8 of the periodic table can also be used. Specifically, vanadium oxide, niobium oxide, tantalum oxide, chromium oxide, molybdenum oxide, tungsten oxide, manganese oxide, and rhenium oxide are preferably used because of their high electron-accepting properties. Among them, molybdenum oxide is especially preferable because it is stable in the air and has a low hygroscopic property, thereby being easily handled.

As the organic compound used for the hole-injecting composite material, it is possible to use various compounds such as an aromatic amine compound, a carbazole derivative, an aromatic hydrocarbon, and a high molecular compound (oligomer, dendrimer, polymer, or the like). Note that the organic compound used for the hole-injecting composite material is preferably an organic compound with a high hole-transporting property. Specifically, it is preferable to use a substance having a hole mobility of $10^{-6}$ cm$^2$/Vs or higher, though other substances may also be used as long as the hole-transporting properties thereof are higher than the electron-transporting properties thereof The organic compounds that can be used for the hole-injecting composite material are specifically described below.

Examples of the aromatic amine compound include: N,N'-di(p-tolyl)-N,N'-diphenyl-p-phenylenediamine (abbreviation: DTDPPA); 4,4'-bis[N-(4-diphenylaminophenyl)-N-phenylamimo]biphenyl (abbreviation: DPAB); N,N'-bis[4-[bis(3-methylphenyl)amino]phenyl]-N,N'-diphenyl-[1,1'-biphenyl]-4,4'-diamine (abbreviation: DNTPD); and 1,3,5-tris[N-(4-diphenylaminophenyl)-N-phenylamino]benzene (abbreviation: DPA3B).

Specific examples of the carbazole derivative used for the hole-injecting composite material include: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1).

Further, it is also possible to use: 4,4'-di(N-carbazolyl)biphenyl (abbreviation: CBP); 1,3,5-tris[4-(N-carbazolyl)phenyl]benzene (abbreviation: TCPB); 9-[4-(N-carbazolyl)]phenyl-10-phenylanthracene (abbreviation: CzPA); 1,4-bis[4-(N-carbazolyl)phenyl]-2,3,5,6-tetraphenylbenzene; or the like.

Examples of the aromatic hydrocarbon used for the hole-injecting composite material include: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthypanthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl) anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; and 2,5,8,11-tetra(tert-butyl)perylene. Besides, pentacene, coronene, or the like can also be used. Further, it is more preferable to use an aromatic hydrocarbon that has a hole mobility of $1 \times 10^{-6}$ cm$^2$/Vs or higher and has 14 to 42 carbon atoms.

The aromatic hydrocarbon used for the hole-injecting composite material may have a vinyl skeleton. Examples of the aromatic hydrocarbon having a vinyl skeleton include 4,4'-bis(2,2-diphenylvinyl)biphenyl (abbreviation: DPVBi) and 9,10-bis[4-(2,2-diphenylvinyl)phenyl]anthracene (abbreviation: DPVPA).

It is also possible to use a high molecular compound such as poly(N-vinylcarbazole) (abbreviation: PVK) or poly(-vinyltriphenylamine) (abbreviation: PVTPA).

The hole-transporting layer 1012 is a layer containing a substance having a high hole-transporting property. The substance having a high hole-transporting property is preferably an aromatic amine compound (i.e., a compound having a benzene ring-nitrogen bond), for example. Widely used examples of the material are as follows: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4"-tris(N,N-diphenylamino) triphenylamine or 4,4',4"-tris[N-(3-methylphenyl)-N-phenylamino]triphenylamine. These substances are mainly substances having a hole mobility of $10^{-6}$ cm$^2$/Vs or higher, though other substances may also be used as long as the hole-transporting properties thereof are higher than the electron-transporting properties thereof. Note that the hole-transporting layer 1012 is not limited to a single layer, but may be a mixed layer of the aforementioned substances, or stacked layers of two or more layers containing the aforementioned substances.

Alternatively, a hole-transporting material may be added to a high molecular compound such as PMMA, which is electrically inactive.

It is also possible to use a high molecular compound such as poly(N-vinylcarbazole) (abbreviation: PVK), poly(4-vinyltriphenylamine) (abbreviation: PVTPA), poly [N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD). Furthermore, the aforementioned hole-transporting material may be added to those high molecular compounds as appropriate. Further alternatively, the hole-transporting layer 1012 can be made of a tris(p-enamine-substituted-aminophenyl)amine compound, a 2,7-diamino-9-fluorenylidene compound, a tri(p-N-enamine-substituted-aminophenyl) benzene compound, a pyrene compound having one or two ethenyl groups having at least one aryl group, N,N'-di(biphenyl-4-yl)-N,N'-diphenyl-biphenyl-4,4'-diamine, N,N,N',N'-tetra(biphenyl-4-yl)biphenyl-4,4'-diamine, N,N,N'N'-tetra(biphenyl-4-yl)-3,3'-diethylbiphenyl-4,4'-diamine, 2,2'-(methylenedi-4,1-phenylene)b is [4,5-bis(4-methoxyphenyl)-2H-1,2,3-triazole], 2,2'-(biphenyl-4,4'-diyl)bis(4,5-diphenyl-2H-1,2,3-triazole), 2,2'-(3,3'-dimethylbiphenyl-4,4'-diyl)bis(4,5-diphenyl-2H-1,2,3-triazole), bis[4-(4,5-diphenyl-2H-1,2,3-triazol-2-yl)phenyl](methyl)amine, or the like.

The light-emitting layer 1013 is a layer containing a light-emitting substance, and may be faulted of a wide variety of materials. For example, a fluorescent compound that exhibits fluorescence or a phosphorescent compound that exhibits phosphorescence can be used as the light-emitting substance. Organic compound materials that can be used for the light-emitting layer will be shown below, though the materials used for the light-emitting element are not limited to the following examples.

Blue to blue-green light emission can be obtained, for example, by using perylene, 2,5,8,11-tetra-t-butylperylene (abbreviation: TBP), 9,10-diphenylanthracene, or the like as a guest material, and dispersing the guest material in a suitable host material. Blue to blue-green light emission can also be obtained from a styrylarylene derivative such as 4,4'-bis (2,2-diphenylvinyl)biphenyl (abbreviation: DPVBi), or an anthracene derivative such as 9,10-di-2-naphthylanthracene (abbreviation: DNA) or 9,10-bis(2-naphthyl)-2-t-butylanthracene (abbreviation: t-BuDNA). Alternatively, a polymer such as poly(9,9-dioctylfluorene) may be used. As a guest material for blue light emission, a styrylamine derivative is preferably used, and examples thereof include N,N'-bis[4-(9H-carbazol-9-yl)phenyl]-N,N'-diphenylstilbene-4,4'-diamine (abbreviation: YGA2S), and NN'-diphenyl-N,N'-bis (9-phenyl-9H-carbazol-3-yl)stilbene-4,4'-diamine (abbreviation: PCA2S). Among them, YGA2S is preferably used because it has a peak at around 450 nm. As a host material, an anthracene derivative such as 9,10-bis(2-naphthyl)-2-t-butylanthracene (abbreviation: t-BuDNA) or 9-[4-(10-phenyl-9-anthryl)phenyl]-9H-carbazole (abbreviation: CzPA) is preferably used. Among them, CzPA is preferably used because it is electrochemically stable.

Blue-green to green light emission can be obtained, for example, by using a coumarin dye such as coumarin 30 or coumarin 6; bis [2-(2,4-difluorophenyl)pyridinato]picolinatoiridium (abbreviation: Flrpic); bis(2-phenylpyridinato) acetylacetonatoiridium (abbreviation: Ir(ppy)$_2$(acac)); or the like as a guest material and dispersing the guest material in a suitable host material. Blue-green to green light emission can also be obtained by dispersing the aforementioned perylene or TBP in a suitable host material at a high concentration of 5 wt % or more. Alternatively, blue-green to green light emission can be obtained from a metal complex such as BAlq, Zn(BTZ)$_2$, or bis(2-methyl-8-quinolinolato)chlorogallium (Ga(mq)$_2$Cl). It is also possible to use a polymer such as poly(p-phenylenevinylene). As a guest material for a blue-green to green light-emitting layer, an anthracene derivative is preferably used because high emission efficiency can be obtained. For example, blue-green light emission with high efficiency can be obtained by using 9,10-bis{4-[N-(4-diphenylamino)phenyl-N-phenyl]aminophenyl}-2-tert-butylanthracene (abbreviation: DPABPA). Further, an anthracene derivative in which an amino group has been substituted into the 2-position is preferably used because green light emission with high efficiency can be obtained. In particular, N-(9,10-diphenyl-2-anthryl)-N,9-diphenyl-9H-carbazol-3-amine (abbreviation: 2PCAPA) that has a long life is preferably used. As a host material for these materials, an anthracene derivative is preferably used, and the aforementioned CzPA is preferably used because it is electrochemically stable. Further, in the case where a light-emitting element having two peaks in the blue to green wavelength range is manufactured by combining green light emission and blue light emission, an anthracene derivative having electron-transporting properties, such as CzPA, is preferably used as a host material for a blue-light-emitting layer and an aromatic amine compound having hole-transporting properties, such as NPB, is preferably used as a host material for a green-light-emitting layer, so that light emission can be obtained at the interface between the blue-light-emitting layer and the green-light-emitting layer. That is, in such a case, an aromatic amine compound like NPB is preferably used as a host material of a green-light-emitting material such as 2PCAPA.

Yellow to orange light emission can be obtained, for example, by using rubrene; 4-(dicyanomethylene)-2-[p-(dimethylamino)styryl]-6-methyl-4H-pyran (abbreviation: DCM1); 4-(dicyanomethylene)-2-methyl-6-(9-julolidyl) ethenyl-4H-pyran (abbreviation: DCM2); bis[2-(2-thienyl) pyridinato]acetylacetonatoiridium (abbreviation: Ir(thp)$_2$ (acac)); bis(2-phenylquinolinato)acetylacetonatoiridium (abbreviation: Ir(pq)$_2$(acac)); or the like as a guest material and dispersing the guest material in a suitable host material. In particular, a tetracene derivative such as rubrene is preferably used as a guest material because it is highly efficient and chemically stable. As a host material in that case, an aromatic amine compound such as NPB is preferably used. Alternatively, a metal complex such as bis(8-quinolinolato)zinc (abbreviation: Znq$_2$) or bis[2-cinnamoyl-8-quinolinolato]zinc (abbreviation: Znsq$_2$) can be used as a host material. Further alternatively, a polymer such as poly(2,5-dialkoxy-1,4-phenylenevinylene) may be used.

Orange to red light emission can be obtained, for example, by using 4-(dicyanomethylene)-2,6-bis [p-(dimethylamino) styryl]-4H-pyran (abbreviation: BisDCM); 4-(dicyanomethylene)-2,6-bis [2-(julolidin-9-yl)ethynyl]-4H-pyran (abbreviation: DCM1); 4-(dicyanomethylene)-2-methyl-6-(9-julolidyl)ethenyl-4H-pyran (abbreviation: DCM2); bis [2-(2-thienyl)pyridinato]acetylacetonatoiridium (abbreviation: Ir(thp)$_2$(acac)), or the like as a guest material, and dispersing the guest material in a suitable host material. Orange to red light emission can also be obtained from a metal complex such as bis(8-quinolinolato)zinc (abbreviation: $Znq_2$) or bis [2-cinnamoyl-8-quinolinolato]zinc (abbreviation: $Znsq_2$). Alternatively, a polymer such as poly(3-alkylthiophene) may be used. As a guest material exhibiting red light emission, it is preferable to use a 4H-pyran derivative that has high emission efficiency, such as 4-(dicyanomethylene)-2,6-bis[p-(dimethylamino)styryl]-4H-pyran (abbreviation: BisDCM), 4-(dicyanomethylene)-2,6-bis[2-(julolidin-9-yl)ethynyl]-4H-pyran (abbreviation: DCM1), 4-(dicyanomethylene)-2-methyl-6-(9-julolidyl)ethenyl-4H-pyran (abbreviation: DCM2), {2-isopropyl-6-[2-(2,3,6,7-tetrahydro-1,1,7,7-tetramethyl-1H,5H-benzo [ij]quinolizin-9-yl)ethenyl]-4H-pyran-4-ylidene}propanedinitrile (abbreviation: DCJTI), or {2,6-bis [2-(2,3,6,7-tetrahydro-8-methoxy-1,1,7,7-tetramethyl-1H,5H-benzo [ij]quimolizi n-9-yl)ethenyl]-4H-pyran-4-ylidene}propanedinitrile (abbreviation: BisDCJTM). Among them, DCJTI and BisDCJTM are preferably used because they have an emission peak at around 620 nm.

Note that the light-emitting layer 1013 may have a structure in which any of the above light-emitting substances (guest materials) is dispersed in another substance (a host material). A substance having a high light-emitting property can be dispersed in various kinds of substances, and it is preferably dispersed in a substance that has a lowest unoccupied molecular orbital (LUMO) level higher than that of the substance having a high light-emitting property and has a highest occupied molecular orbital (HOMO) level lower than that of the substance having a high light-emitting property.

Specific examples of the substance in which the substance having light-emitting properties is dispersed are as follows: a metal complex such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(H) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis [2-(2-benzoxazolyl)phenolato]zinc(II) (abbreviation: ZnPBO), or bis [2-(2-benzothiazolyl)phenolato]zinc (II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), or bathocuproine (abbreviation: BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3''-(benzene-1,3,5-triyptripyrene (abbreviation: TPB3), 9,10-diphenylanthracene (abbreviation: DPAnth), or 6,12-dimethoxy-5,11-diphenylchrysene; and an aromatic amine compound such as N,N-diphenyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB, TPD, DFLDPBi, or BSPB.

Further, a light-emitting substance may be dispersed in plural kinds of substances. For example, a substance such as rubrene, which suppresses crystallization, may be further added in order to prevent crystallization. Moreover, NPB, Alq, or the like may be further added in order to increase the efficiency in energy transfer to the light-emitting substance.

By dispersing a light-emitting substance in another substance, crystallization of the light-emitting layer 1013 can be suppressed. Furthermore, it is also possible to suppress concentration quenching due to a high concentration of a light-emitting substance.

The electron-transporting layer 1014 is a layer containing a substance having a high electron-transporting property. Examples of the substance having a high electron-transporting property include: a metal complex having a quinoline skeleton or a benzoquinoline skeleton, such as tris(8-quinolinolato)aluminum (abbreviation: Alq), tris(4-methyl-8-quinolinolato)aluminum (abbreviation: $Almq_3$), bis(10-hydroxybenzo[h]quinolinato)beryllium (abbreviation:. $BeBq_2$), or bis(2-methyl-8-quinolinolato)(4-phenylphenolato)aluminum (abbreviation: BAlq). Alternatively, a metal complex having an oxazole-based ligand or a thiazole-based ligand, such as bis[2-(2-hydroxyphenyl)benzoxazolato]zinc (abbreviation: $Zn(BOX)_2$) or bis[2-(2-hydroxyphenyl)benzothiazolato]zinc (abbreviation: $Zn(BTZ)_2$) can be used. Besides the metal complexes, it is also possible to use 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), bis[3-(1H-benzimidazol-2-yl)fluoren-2-olato]zinc(II), bis[3-(1H-benzimidazol-2-yl)fluoren-2-olato]beryllium(II), bis[2-(1H-benzimidazol-2-yl)dibenzo[b,d]furan-3-olato](phenolato) aluminum(III), bis[2-(benzoxazol-2-yl)-7,8-methylenedioxydibenzo[b,d]furan-3-olato](2-naphtholato) aluminum(III), or the like. The substances described here are mainly substances having an electron mobility of $10^{-6}$ $cm^2$/Vs or higher, though the electron-transporting layer 1014 may be made of other substances as long as the electron-transporting properties thereof are higher than the hole-transporting properties thereof. Note that the electron-transporting layer 1014 is not limited to a single layer, but may be stacked layers of two or more layers containing the aforementioned substances.

The electron-injecting layer 1015 is a layer containing a substance having a high electron-injecting property. Examples of the substance having a high electron-injecting property include an alkali metal, an alkaline earth metal, and a compound of these metals, such as lithium fluoride (LiF), cesium fluoride (CsF), or calcium fluoride ($CaF_2$). It is also possible to use an electron-injecting composite material including an organic compound (preferably, an organic compound having electron-transporting properties) and an inorganic compound (preferably, an alkali metal, an alkaline earth metal, a rare earth metal, or a compound of these metals). As the electron-injecting composite material, for example, a layer made of Alq mixed with magnesium (Mg) may be used. Such a structure increases the efficiency in electron injection from the cathode 1002.

In the case where the electron-injecting layer 1015 is made of the aforementioned electron-injecting composite material, a variety of conductive materials such as Al, Ag, ITO, or ITO containing silicon or silicon oxide can be used for the cathode 1002 regardless of the work function.

The EL layer 1003 can be formed by stacking the above layers in appropriate combination. Note that the light-emitting layer 1013 may have a stacked structure of two or more layers. When the light-emitting layer 1013 has a stacked structure of two or more layers and the kind of light-emitting substance for each light-emitting layer is changed, various emission colors can be obtained. In addition, by using plural kinds of light-emitting substances having different emission colors, light emission with a broad spectrum or white light emission can also be obtained. A light-emitting layer having a stacked structure is preferably used particularly for lighting devices that require high luminance The EL layer 1003 can be formed by various methods (e.g., a dry process or a wet process), which can be selected as appropriate depending on a material used. For example, the EL layer 1003 can be formed by vacuum evaporation, sputtering, ink-jet, or spin coating. Each layer of the EL layer 1003 may be formed by a different method.

Further, the light-emitting element shown in this embodiment can be formed by various methods such as a dry process (e.g., vacuum evaporation or sputtering), or a wet process (e.g., ink-jet or spin coating).

Figure 14B:
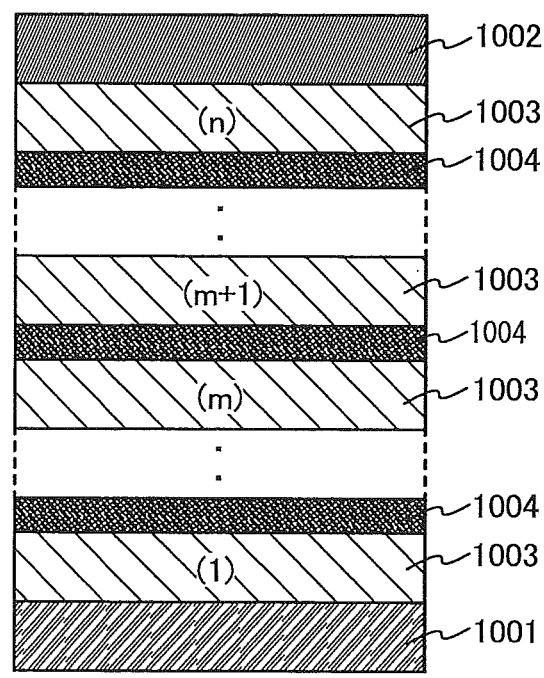

Note that the light-emitting element shown in this embodiment may have a structure illustrated in FIG. 14B, a so-called stacked element structure, in which a plurality of the EL layers 1003 are stacked between a pair of electrodes. Note that in the case where the El layer 1003 has a stacked structure including, for example, n layers (n is a natural number of two or more), an intermediate layer 1004 is provided between an m-th (m is a natural number, $1 \leq m \leq n-1$) EL layer and an (m+1)-th EL layer.

The intermediate layer 1004 has a function of, when a voltage is applied to the anode 1001 and the cathode 1002, injecting holes to one of the EL layers 1003 in contact with the intermediate layer 1004, which is on the anode 1001 side, and injecting electrons to the other EL layer 1003 on the cathode 1002 side.

The intermediate layer 1004 can be made of the aforementioned composite materials (a hole-injecting composite material or an electron-injecting composite material) of an organic compound and an inorganic compound, metal oxides, and the like in appropriate combination. More preferably, the intermediate layer 1004 is made of a combination of a hole-injecting composite material and other materials. Such materials used for the intermediate layer 1004 have excellent carrier-injecting properties and carrier-transporting properties, whereby a light-emitting element driven with low current and low voltage can be realized.

In the case where an EL layer has two stacked layers in a stacked element structure, white light emission can be obtained by allowing a first EL layer and a second EL layer to emit light of complementary colors. Note that white light emission can also be obtained in a structure where each of the first EL layer and the second EL layer includes a plurality of light-emitting layers emitting light of complementary colors. Examples of complementary colors include blue and yellow, and blue-green and red. A substance emitting light of blue, yellow, blue-green, or red may be selected as appropriate from, for example, the light-emitting substances given above.

The following is an example of the structure where each of the first EL layer and the second EL layer includes a plurality of light-emitting layers emitting light of complementary colors.

For example, the first EL layer includes a first light-emitting layer that emits light having an emission spectrum with a peak in the wavelength range of blue to blue-green, and a second light-emitting layer that emits light having an emission spectrum with a peak in the wavelength range of yellow to orange. The second EL layer includes a third light-emitting layer that emits light having an emission spectrum with a peak in the wavelength range of blue-green to green, and a fourth light-emitting layer that emits light having an emission spectrum with a peak in the wavelength range of orange to red.

In that case, light emission from the first EL layer is a combination of light emission from both the first light-emitting layer and the second light-emitting layer and thus exhibits an emission spectrum having peaks both in the wavelength range of blue to blue-green and in the wavelength range of yellow to orange. That is, the first EL layer emits light of two-wavelength white color or almost white color.

Further, light emission from the second EL layer is a combination of light emission from both the third light-emitting layer and the fourth light-emitting layer and thus exhibits an emission spectrum having peaks both in the wavelength range of blue-green to green and in the wavelength range of orange to red. That is, the second EL layer emits light of two-wavelength white color or almost white color, which is different from that of the first EL layer.

Accordingly, a combination of the light-emission from the first EL layer and the light emission from the second EL layer provides white light emission that covers the wavelength range of blue to blue-green, the wavelength range of blue-green to green, the wavelength range of yellow to orange, and the wavelength range of orange to red.

Note that in the aforementioned stacked element structure, the intermediate layer between the stacked EL layers allows the element to have a long lifetime in a high-luminance region while keeping the current density low. In addition, the voltage drop due to the resistance of the electrode material can be reduced, resulting in uniform light emission in a large area.

What is described in this embodiment with reference to each drawing can be freely combined with or replaced with what is described in other embodiments as appropriate.

(Embodiment 5)

In this embodiment, a structure in which a connecting member 150 is attached to the lighting device 130 shown in the above embodiments will be described as an example of the application of the lighting device with reference to FIGS. 10A to 10D. Note that the connecting member 150 is also referred to as a cap. Further, the lighting device 130 and the connecting member 150 are collectively referred to as a lighting device in some cases.

The connecting member 150 includes a control circuit 152, and a first connecting wiring 154, a second connecting wiring 156, a first leading wiring 158, and a second leading wiring 160 that are electrically connected to the control circuit 152.

The control circuit 152 has a function of making the light-emitting element 132 emit light with a constant luminance on the basis of a power source voltage supplied from an external power source. The control circuit 152 includes, for example, a rectifying and smoothing circuit, a constant voltage circuit, and a constant current circuit. The rectifying and smoothing circuit is a circuit for converting an AC voltage supplied from an external AC power source into a DC voltage. The rectifying and smoothing circuit may be formed by, for example, a combination of a diode bridge circuit, a smoothing capacitor, and the like. The constant voltage circuit is a circuit for stabilizing a DC voltage having ripples output from the rectifying and smoothing circuit and outputting a constant voltage. The constant voltage circuit may be formed by a switching regulator, a series regulator, or the like. The constant current circuit is a circuit for outputting a constant current to the light-emitting element 132 in accordance with the voltage of the constant voltage circuit. The constant current circuit may be formed by a transistor or the like. Note that the rectifying and smoothing circuit is provided on the assumption that a commercial AC power source is used as the external power source; however, the rectifying and smoothing circuit is not necessarily provided in the case of using a DC power source as the external power source. The control circuit 152 may be provided with a circuit for controlling luminance, a protective circuit for protection against surge, or the like as needed.

The first connecting wiring 154 and the second connecting wiring 156 serve as wirings for electrically connecting the control circuit 152 to the light-emitting element 132 provided in the lighting device 130. Specifically, the first connecting wiring 154 is electrically connected to the first connecting portion 112 over the substrate 101, and the second connecting wiring 156 is electrically connected to the second connecting portion 114 over the substrate 101 (see FIG. 12).

Figure 12:
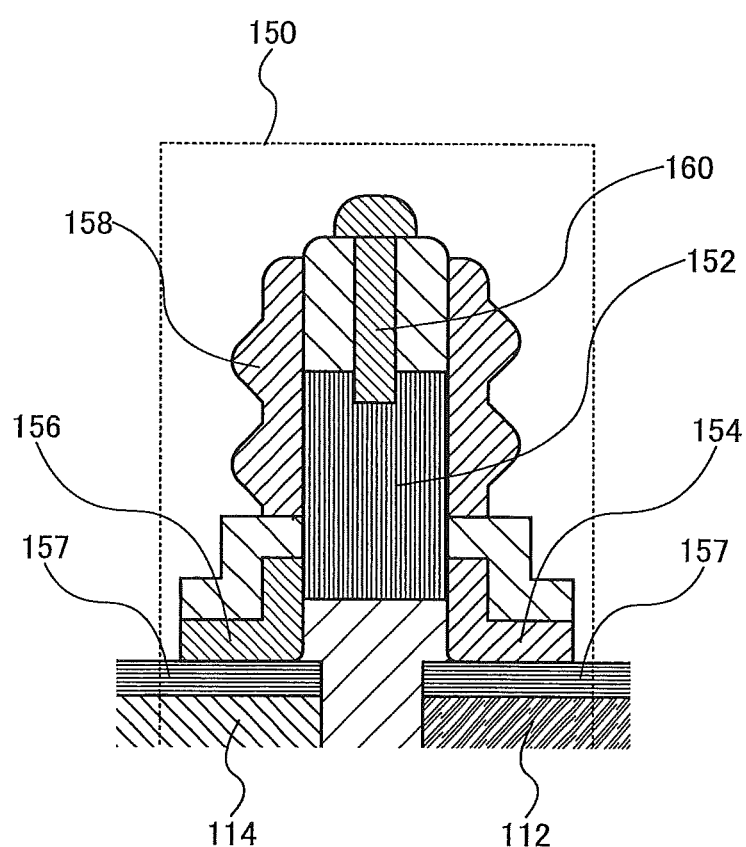
FIG. 12 is a diagram illustrating an example of the lighting device of Embodiment 5.

Electrical connection between the first connecting wiring 154 and the first connecting portion 112, and electrical connection between the second connecting wiring 156 and the second connecting portion 114 can be conducted by using an anisotropic conductive paste 157 as illustrated in FIG. 12. Note that the electrical connection can be conducted not only by using an anisotropic conductive paste (ACP) but also by pressure-bonding with an anisotropic conductive film (ACF) or the like. Alternatively, a conductive adhesive such as silver paste, copper paste, or carbon paste, soldering, or the like may be used for the electrical connection.

The first leading wiring 158 and the second leading wiring 160 are electrically connected to the control circuit 152, and serve as wirings for supplying electric power to the lighting device 130 from the outside.

Figure 10A:
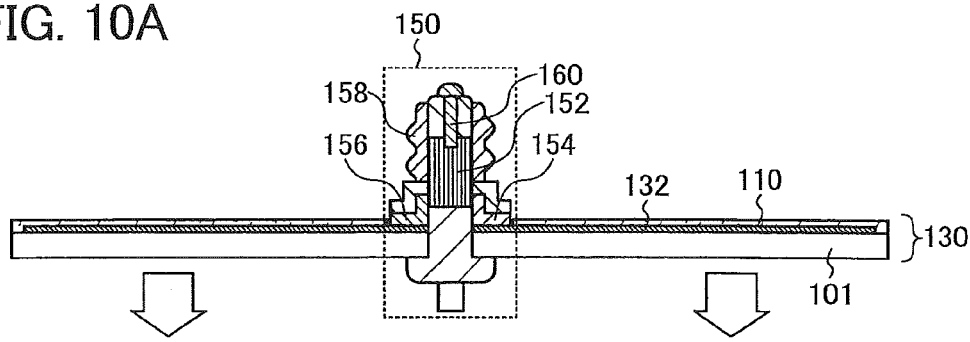
FIGS. 10A to 10D are diagrams each illustrating an example of a lighting device of Embodiment 5.

FIG. 10A illustrates a structure (a bottom emission structure) in which light is emitted to the substrate 101 side (the side opposite to the surface on which the insulating film 110 is provided). In that case, the control circuit 152 in the connecting member 150 can be provided over the insulating film 110.

Figure 10B:
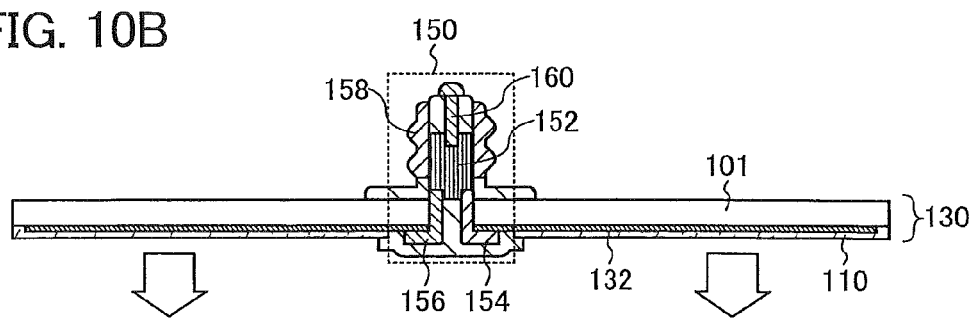

Light emission from the light-emitting element 132 is not limited to the example illustrated in FIG. 10A. As illustrated in FIG. 10B, a structure (a top emission structure) in which light is emitted to the insulating film 110 side (the side opposite to the substrate 101 side) may be adopted. In that case, the control circuit 152 is provided on the back surface of the substrate 101 (the surface opposite to the surface on which the light-emitting element 132 is provided), and the first connecting wiring 154 and the second connecting wiring 156 can be electrically connected to the light-emitting element 132 through the opening provided in the substrate 101.

In the structures in FIGS. 10A and 10B, a desiccant is preferably provided on the surface opposite to the surface to which light is emitted (on the insulating film 110 in FIG. 10A, and on the back surface of the substrate 101 in FIG. 10B). The desiccant can be formed by sputtering or the like. Particularly when the desiccant is provided on the back surface of the substrate 101, it can be formed on the entire surface by sputtering.

FIGS. 10A and 10B illustrate the structure in which a fitting portion of the connecting member 150 also serves as the first leading wiring 158 and a contact portion of the connecting member 150 is connected to the second leading wiring 160, though the present invention is not limited to this structure. As another structure, for example, the two fitting portions of the connecting member 150 may also serve as the first leading wiring 158 and the second leading wiring 160 as illustrated in FIGS. 10C and 10D.

Figure 10C:
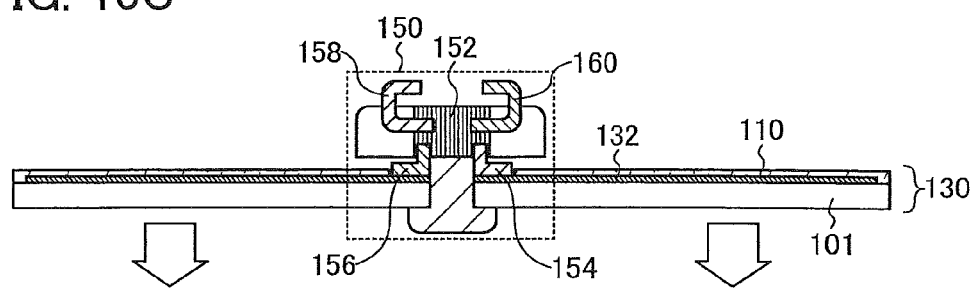
Figure 10D:
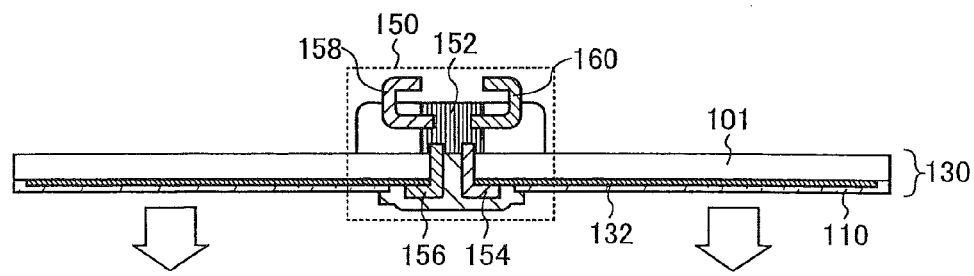

Note that FIG. 10C is similar to FIG. 10A, except for the structure of the connecting member 150, and FIG. 10D is similar to FIG. 10B, except for the structure of the connecting member 150.

In addition, the lighting device 130 may be provided with a sealing substrate 136 (see FIGS. 11A to 11D). The sealing substrate 136 provided over the substrate 101 with the light-emitting element 132 interposed therebetween can prevent intrusion of moisture or the like into the light-emitting element 132.

As the sealing substrate 136, a round-shaped (disk-shaped or circle-shaped) substrate having an opening in its center can be used. Specifically, a glass substrate, a ceramic substrate, a quartz substrate, a metal substrate, or the like can be used. Alternatively, a plastic substrate made of polycarbonate, polyarylate, polyether sulfone, or the like can be used. Further alternatively, a film (made of polypropylene, polyester, vinyl, polyvinyl fluoride, vinyl chloride, or the like), or an inorganic film formed by evaporation can be used.

A flexible substrate may also be used as the sealing substrate 136. The flexible substrate is a substrate that can be bent. It is also possible to use a conductive substrate such as a stainless steel alloy substrate; in that case, the sealing substrate 136 is provided so as to be insulated from the first connecting wiring 154, the second connecting wiring 156, the first leading wiring 158, and the second leading wiring 160. Other substrates may be used as long as they function as sealing substrates.

Figure 11A:
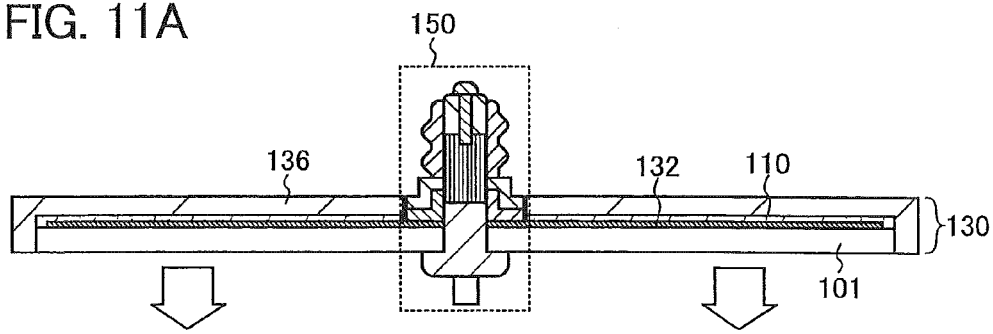
FIGS. 11A to 11D are diagrams each illustrating an example of the lighting device of Embodiment 5.
Figure 11B:
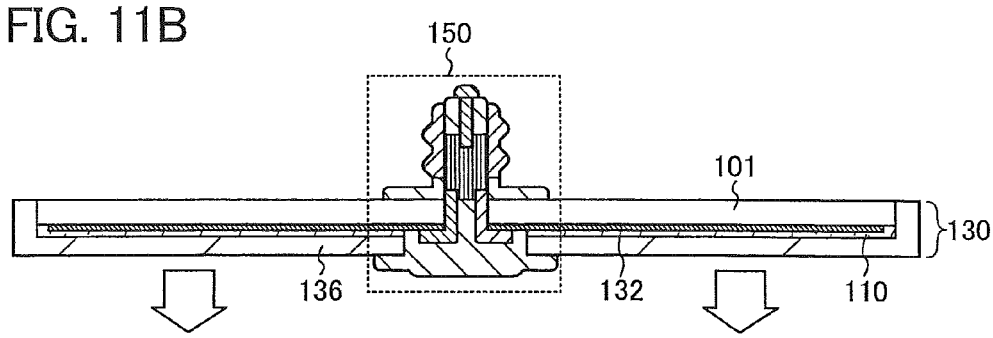
Figure 11C:
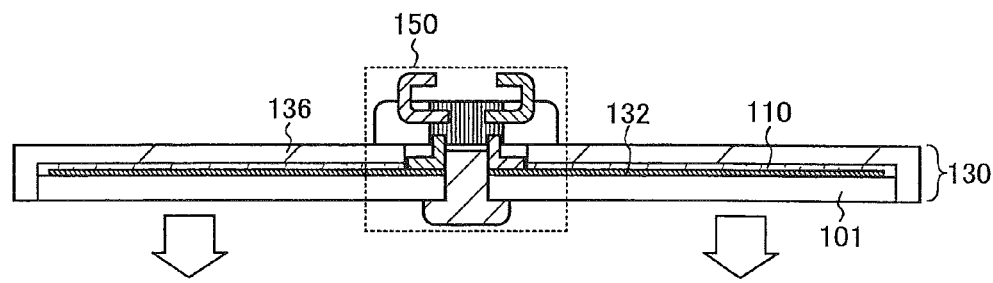
Figure 11D:
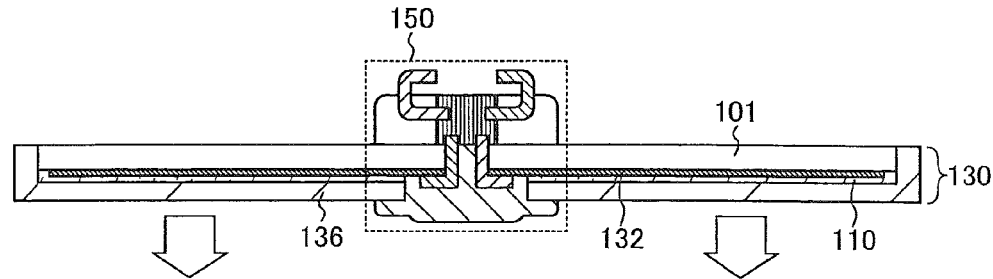

FIGS. 11B and 11D illustrate a structure of using the sealing substrate 136 that transmits visible light.

The sealing substrate 136 may be provided on the insulating film 110, for example, may be bonded to the insulating film 110. In FIGS. 11A to 11D, the sealing substrate 136 is provided to cover the side surfaces of the substrate 101, though the present invention is not limited to this structure.

Note that FIGS. 11A to 11D are similar to FIGS. 10A to 10D, respectively, except the sealing substrate 136 is provided.

Next, an example of the application of the lighting device 130 provided with the connecting member 150 will be described (see FIGS. 13A and 13B).

Figure 13A:
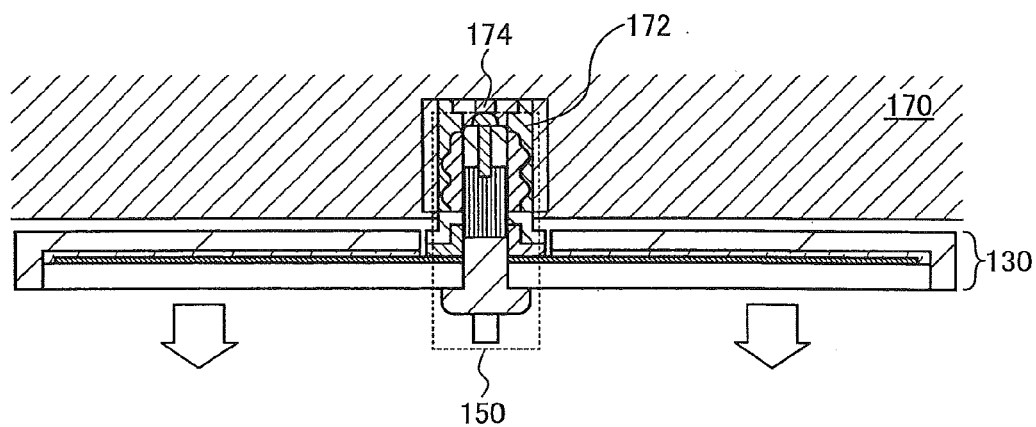
FIGS. 13A and 13B are diagrams each illustrating an example of the lighting device of Embodiment 5.
Figure 13B:
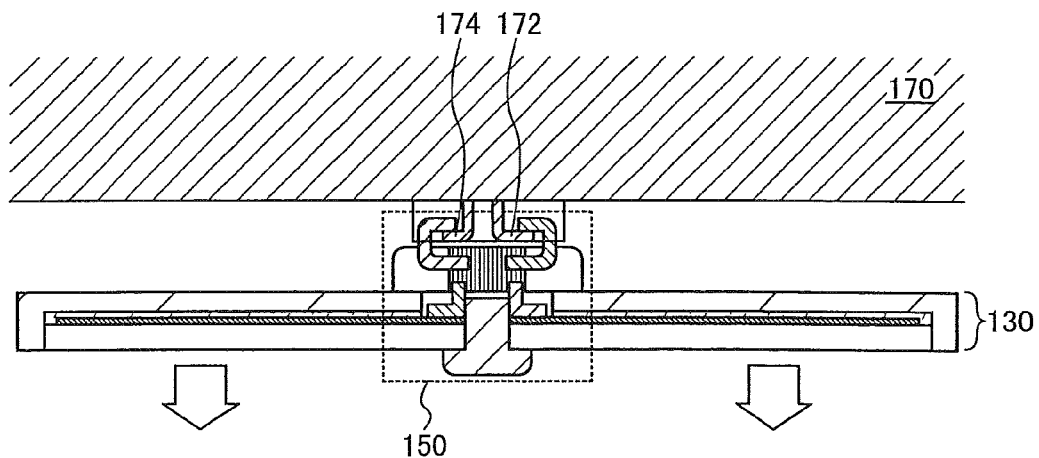

In FIGS. 13A and 13B, the connecting member 150 attached to the lighting device 130 is provided on a ceiling 170. The ceiling 170 includes a first external electrode 172 and a second external electrode 174. The first external electrode 172 is electrically connected to the first leading wiring 158 in the connecting member 150 while the second external electrode 174 is electrically connected to the second leading wiring 160, whereby electric power is supplied to the light-emitting element 132 from the outside through the control circuit 152. Thus, the lighting device 130 can perform its function.

In the structure illustrated in FIG. 13A, the diameter of the connecting member 150 (the length in parallel to the surface of the substrate 101) may be determined depending on the size of a mounting portion of the ceiling 170, and may be 10 mm to 40 mm (e.g., 26 mm).

In FIG. 13A, the structure illustrated in FIG. 11A is attached to the ceiling 170, and in FIG. 13B, the structure illustrated in FIG. 11C is attached to the ceiling 170. However, the present invention is not limited to these examples, and another structure may also be attached to the ceiling 170.

Although the lighting device 130 is attached to the ceiling 170 in FIGS. 13A and 13B, since the lighting device 130 shown in this embodiment is thin, it can also be buried in the wall or floor.

What is described in this embodiment with reference to each drawing can be freely combined with or replaced with what is described in other embodiments as appropriate.

(Embodiment 6)

In this embodiment, application examples of the lighting device will be described.

Figure 15:
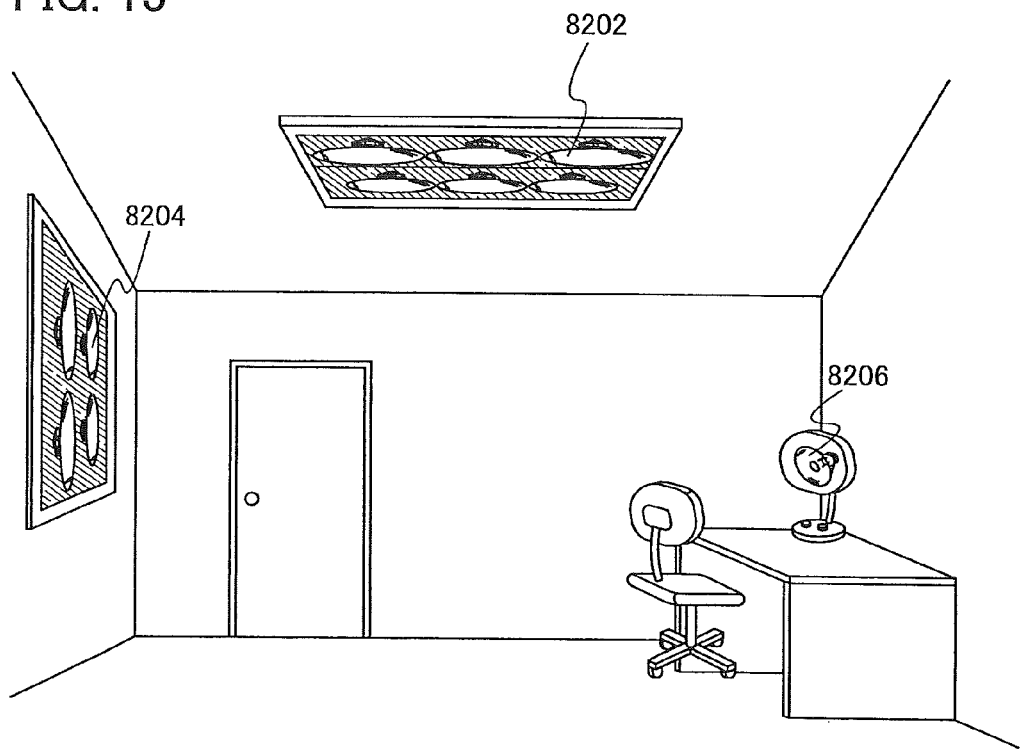
FIG. 15 is a diagram illustrating an example of a lighting device of Embodiment 6.

FIG. 15 illustrates an example in which the lighting device of one embodiment of the present invention is used as an indoor lighting device. The lighting device of one embodiment of the present invention can be used not only as a ceiling-mounted lighting device 8202, but also as a wall-mounted lighting device 8204. The lighting device can also be used as a desk lighting device 8206. Since the lighting device of one embodiment of the present invention has a planar light source, it has advantages such as a reduction in the number of components like a light-reflecting plate as compared with the case of using a point light source, or less heat generation as compared with a filament bulb, and is preferably used as an indoor lighting device.

Figure 16A:
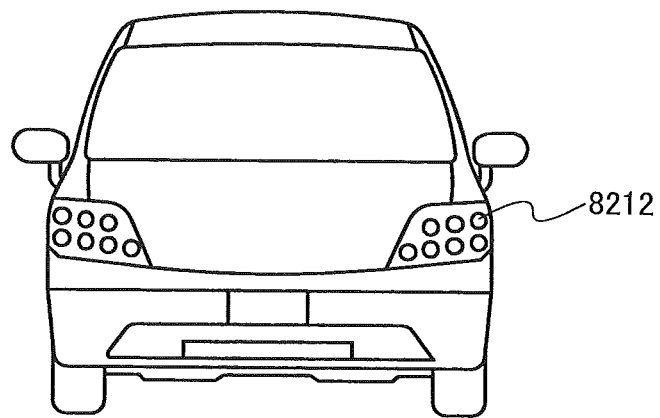
FIGS. 16A to 16C are diagrams illustrating an example of the lighting device of Embodiment 6.
Figure 16B:
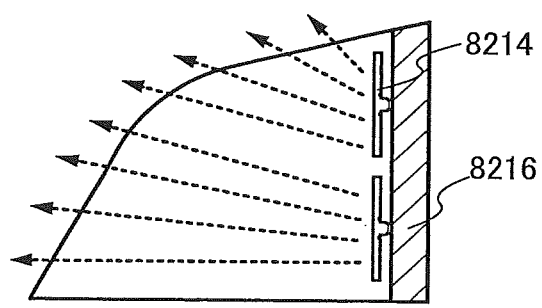
Figure 16C:
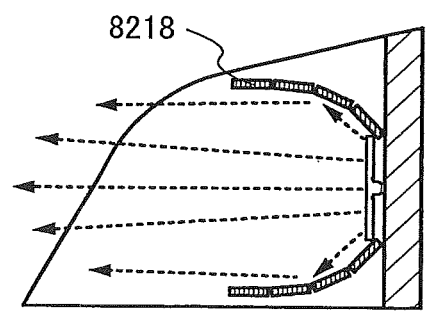

The lighting device of one embodiment of the present invention can also be used as headlights of an automobile, a bicycle, or the like. FIGS. 16A to 16C illustrate an example of using the lighting device of one embodiment of the present invention as headlights of an automobile. FIG. 16A is an external view of an automobile using the lighting device of one embodiment of the present invention as headlights 8212. FIGS. 16B and 16C are cross-sectional views of the headlights 8212 of FIG. 16A. In FIGS. 16B and 16C, lighting devices 8214 connected to a power supplying connector 8216 are used as light sources. Since the plurality of lighting devices 8214 are used in FIG. 16B, high-luminance light can be emitted to the outside. On the other hand, in FIG. 16C, light from the lighting device is condensed by reflecting plates 8218, whereby high-luminance light having directivity can be emitted to the outside.

Figure 17A:
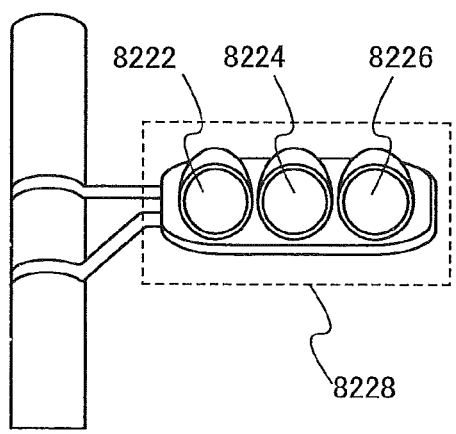
FIGS. 17A to 17E are diagrams each illustrating an example of the lighting device of Embodiment 6.

Next, FIG. 17A illustrates an example in which the lighting device of one embodiment of the present invention is applied to a lighting device such as traffic lights or guide lights.

For example, FIG. 17A is an external view of a traffic light. A traffic light 8228 includes a green light 8222, an amber light 8224, and a red light 8226. The traffic light 8228 includes the lighting device of one embodiment of the present invention as a lighting device corresponding to each of the green, amber, and red lights.

Figure 17B:
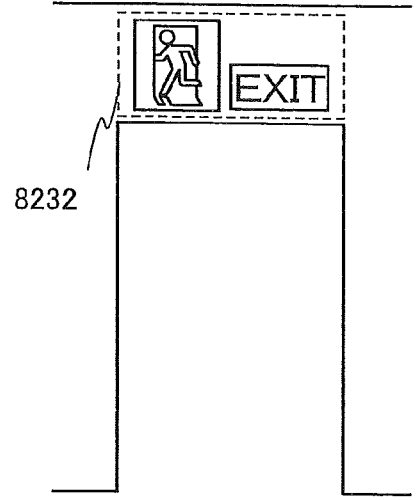

FIG. 17B illustrates an example in which the lighting device of one embodiment of the present invention is applied to an emergency exit light.

For example, FIG. 17B is an external view of an emergency exit light. An emergency exit light 8232 can be formed by combination of a lighting device and a fluorescent plate provided with a fluorescent portion. The emergency exit light 8232 can also be formed by combination of a lighting device emitting a specific light and a light-shielding plate provided with a transmitting portion having a shape illustrated in FIG. 17B. The lighting device of one embodiment of the present invention can emit light with a constant luminance, and thus is preferably used as an emergency exit light that needs to be on at all times.

Figure 17C:
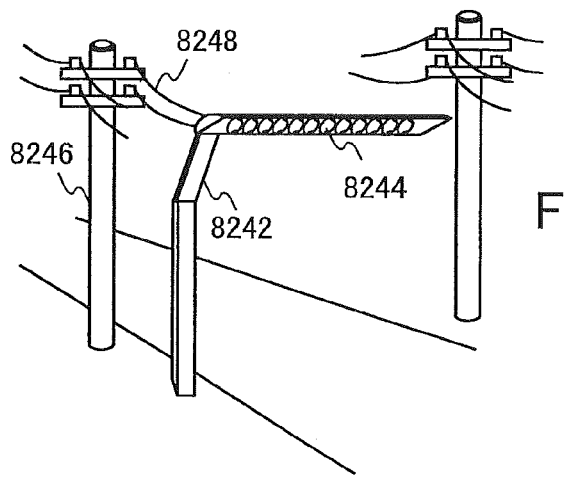

FIG. 17C illustrates an example in which the lighting device of one embodiment of the present invention is applied to an outdoor light.

An example of the outdoor light is a streetlight. A streetlight can be formed by, for example, a housing 8242 and a lighting portion 8244 as illustrated in FIG. 17C. A plurality of lighting devices of one embodiment of the present invention are arranged in the lighting portion 8244. As illustrated in FIG. 17C, for example, the streetlight stands by the side of a road so that the lighting portion 8244 can illuminate the surroundings, whereby the visibility of the road and its surroundings can be improved.

In the case where a power source voltage is supplied to the streetlight, for example, it can be supplied through a power line 8248 on a utility pole 8246 as illustrated in FIG. 17C. Note that the present invention is not limited to this case; for example, a photoelectric converter may be provided in the housing 8242 so that a voltage obtained from the photoelectric converter can be used as a power source voltage.

Figure 17D:
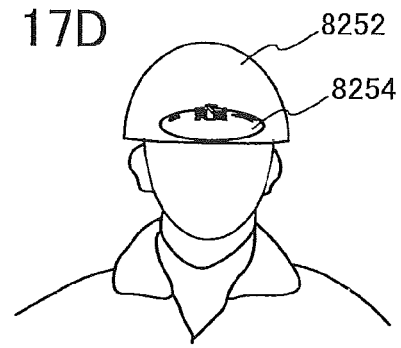
Figure 17E:
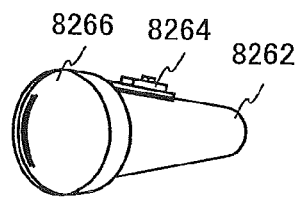

FIGS. 17D and 17E illustrate examples in which the lighting device of one embodiment of the present invention is applied to a portable light. FIG. 17D illustrates a structure of a mounted light and FIG. 17E illustrates a structure of a handheld light.

The mounted light illustrated in FIG. 17D includes a mounting portion 8252 and a lighting portion 8254 fixed to the mounting portion 8252. The lighting device of one embodiment of the present invention can be used for the lighting portion 8254. In the mounted light illustrated in FIG. 17D, the lighting portion 8254 can emit light while the mounting portion 8252 is attached to the head. When a planar light source is used for the lighting portion 8254, the visibility of the surroundings can be improved. In addition, the lighting portion 8254 is lightweight, which makes it possible to reduce the load on the head on which the light is mounted.

Note that the structure of the mounted light is not limited to that illustrated in FIG. 17D, and for example, the following structure can be employed: the mounting portion 8252 is formed as a ring belt of flat braid or elastic braid, the lighting portion 8254 is fixed to the belt, and the belt is directly tied around the head.

The handheld light illustrated in FIG. 17E includes a housing 8262, a lighting portion 8266, and a switch 8264. The lighting device of one embodiment of the present invention can be used for the lighting portion 8266. The use of the lighting device of one embodiment of the present invention reduces the thickness of the lighting portion 8266 and thus reduces the size of the light, which makes it easy for the light to be carried around.

The switch 8264 has a function of controlling emission or non-emission of the lighting portion 8266. The switch 8264 can also have a function of controlling, for example, the luminance of the lighting portion 8266 during light emission.

In the handheld light illustrated in FIG. 17E, the lighting portion 8266 is turned on with the switch 8264 so as to illuminate the surroundings, whereby the visibility of the surroundings can be improved. Furthermore, since the lighting device of one embodiment of the present invention has a planar light source, the number of components like a light-reflecting plate can be reduced as compared with the case of using a point light source.

What is described in this embodiment with reference to each drawing can be freely combined with or replaced with what is described in other embodiments as appropriate.

This application is based on Japanese Patent Application serial No. 2009-066765 filed with Japan Patent Office on Mar. 18, 2009, the entire contents of which are hereby incorporated by reference.

What is claimed is:

1. A lighting device comprising:
   a substrate having a first opening in a center of the substrate;

a first electrode layer over the substrate;
a conductive layer over the substrate;
an EL layer over the first electrode layer;
a second electrode layer over the EL layer and electrically connected to the conductive layer;
an insulating film covering the substrate, the first electrode layer, the EL layer, and the second electrode layer, and having a second opening in the center of the substrate; and
a first connecting portion and a second connecting portion over the substrate and in the second opening,
wherein the first connecting portion is formed by the first electrode layer led to the second opening, and
wherein the second connecting portion is formed by the conductive layer provided in the second opening.

2. The lighting device according to claim 1, wherein the first electrode layer and the conductive layer are made of the same material.

3. The lighting device according to claim 1, wherein the substrate has a round shape.

4. The lighting device according to claim 3, wherein the substrate has a diameter of 10 cm to 14 cm.

5. The lighting device according to claim 1, wherein a plurality of the first connecting portions and a plurality of the second connecting portions are provided in the second opening.

6. The lighting device according to claim 1, wherein a base insulating film is provided between the substrate and the first electrode layer.

7. The lighting device according to claim 1, wherein a desiccant layer is provided between the second electrode layer and the insulating film.

8. The lighting device according to claim 1, wherein the EL layer includes a plurality of light-emitting layers.

9. A lighting device comprising:
a substrate having a first opening in a center of the substrate;
a first electrode layer over the substrate, the first electrode layer having a second opening which overlaps the first opening;
an EL layer over the first electrode layer;
a second electrode layer over the EL layer, the second electrode layer having a third opening which overlaps the first opening;
a conductive layer electrically connected to a part of an edge of the second opening; and
an insulating film covering the substrate, the first electrode layer, the EL layer, and the second electrode layer, and having a fourth opening in the center of the substrate,
wherein the conductive layer is provided in the fourth opening, and
wherein a part of the second electrode layer extends beyond an edge of the fourth opening.

10. The lighting device according to claim 9, wherein the second electrode layer and the conductive layer are made of the same material.

11. The lighting device according to claim 9, wherein the substrate has a round shape.

12. The lighting device according to claim 11, wherein the substrate has a diameter of 10 cm to 14 cm.

13. The lighting device according to claim 9, wherein a plurality of the conductive layers and a plurality of the parts of the second electrode layer are provided in the fourth opening.

14. The lighting device according to claim 9, wherein a base insulating film is provided between the substrate and the first electrode layer.

15. The lighting device according to claim 9, wherein a desiccant layer is provided between the second electrode layer and the insulating film.

16. The lighting device according to claim 9, wherein the EL layer includes a plurality of light-emitting layers.

17. A lighting device comprising:
a substrate having a first opening in a center of the substrate;
a first electrode layer over the substrate, the first electrode layer having a second opening which overlaps the first opening;
a conductive layer provided over the substrate;
an EL layer over the first electrode layer;
a second electrode layer over the EL layer, the second electrode layer having a third opening which overlaps the first opening; and
an insulating film covering the substrate, the first electrode layer, the EL layer, and the second electrode layer, and having a fourth opening in the center of the substrate,
wherein the conductive layer is electrically connected to a part of an edge of the third opening and provided in the fourth opening, and
wherein a part of the first electrode layer extends beyond an edge of the fourth opening.

18. The lighting device according to claim 17, wherein the first electrode layer and the conductive layer are made of the same material.

19. The lighting device according to claim 17, wherein the substrate has a round shape.

20. The lighting device according to claim 19, wherein the substrate has a diameter of 10 cm to 14 cm.

21. The lighting device according to claim 17, wherein a plurality of the parts of the second electrode layer and a plurality of the conductive layers are provided in the fourth opening.

22. The lighting device according to claim 17, wherein a base insulating film is provided between the substrate and the first electrode layer.

23. The lighting device according to claim 17, wherein a desiccant layer is provided between the second electrode layer and the insulating film.

24. The lighting device according to claim 17, wherein the EL layer includes a plurality of light-emitting layers.

* * * * *